(12) United States Patent
Yang

(10) Patent No.: US 10,629,993 B2
(45) Date of Patent: Apr. 21, 2020

(54) METHOD AND APPARATUS FOR A 60 GHZ ENDFIRE ANTENNA

(75) Inventor: HungYu David Yang, Darien, IL (US)

(73) Assignee: HungYu David Yang, Darien, IL (US)

( * ) Notice: Subject to any disclaimer, the term of this patent is extended or adjusted under 35 U.S.C. 154(b) by 1083 days.

(21) Appl. No.: 13/552,943

(22) Filed: Jul. 19, 2012

(65) Prior Publication Data

US 2014/0022135 A1    Jan. 23, 2014

(51) Int. Cl.
*H01Q 9/16* (2006.01)
*H01Q 9/04* (2006.01)
*H01Q 13/08* (2006.01)

(52) U.S. Cl.
CPC ............. *H01Q 9/16* (2013.01); *H01Q 9/0485* (2013.01); *H01Q 13/085* (2013.01)

(58) Field of Classification Search
CPC ....... H01Q 9/16; H01Q 9/0485; H01Q 13/085
USPC .......................................... 343/793
See application file for complete search history.

(56) References Cited

U.S. PATENT DOCUMENTS

| | | | |
|---|---|---|---|
| 4,051,478 A * | 9/1977 | Kaloi ..................... | H01Q 1/286 343/700 MS |
| 6,246,376 B1 | 6/2001 | Bork et al. | |
| 6,980,172 B2 | 12/2005 | Kwak et al. | |
| 7,769,345 B2 | 8/2010 | Johnson et al. | |
| 2006/0178162 A1 | 8/2006 | Utakouji et al. | |
| 2007/0008228 A1* | 1/2007 | Yamada ................ | H01Q 1/2225 343/702 |
| 2007/0040759 A1* | 2/2007 | Lee ......................... | H01Q 1/38 343/795 |
| 2007/0046542 A1* | 3/2007 | Andrenko ................ | H01Q 1/32 343/700 MS |

(Continued)

FOREIGN PATENT DOCUMENTS

| | | |
|---|---|---|
| EP | 2256859 A1 | 12/2010 |
| EP | 2258859 | 12/2010 |
| JP | 11-330840 | 11/1999 |

OTHER PUBLICATIONS

Eldek, "Design of Double Dipole Antenna with Enhanced Usable Bandwidth for Wideband Phased Array Applications", 2006, Progress in Electromagnetics Research, 59, pp. 1-15.*

(Continued)

*Primary Examiner* — Graham P Smith
*Assistant Examiner* — Jae K Kim
(74) *Attorney, Agent, or Firm* — Mintz Levin Cohn Ferris Glovsky and Popeo, P.C.

(57) ABSTRACT

The LTCC (Low Temperature Co-fired Ceramic) substrate is used to form an antenna structure operating at 60 GHz. The dielectric constant is high and ranges from 5 to 8. The substrate thickness is fabricated with a thickness between 360 μm to 700 μm. The large dielectric constant and large thickness of the substrate creates a guiding wave in the LTCC that forms an endfire antenna. A high gain signal of 10 dB in a preferred direction occurs by placing the microstrip fed dipole structure in the center of the LTCC substrate creating a dielectric cavity resonator. The creation of a slot in the LTCC substrate between the two microstrip fed dipole structures eliminates beam tilting and allows for the two microstrip fed dipole structures to reduce the coupling to each other thereby providing substantially two isolated endfire antennas. These antennas can be used as multiple receive or transmit antennas.

15 Claims, 24 Drawing Sheets

(56) References Cited

U.S. PATENT DOCUMENTS

2007/0096988 A1* 5/2007 Parsche .............. H01Q 1/38
343/700 MS
2008/0009984 A1 1/2008 Lee et al.
2011/0147059 A1* 6/2011 Ma .............. H01L 23/49822
174/258

OTHER PUBLICATIONS

Il Kwon Kim, Stephan Pinel*, John Papapoly merou*, Manos M. Tentzeris*, Joy Laskar*, and Jong-Gwan Yook, "Linear Tapered Slot Antennas on LTCC Substrate for Millimeter-wave Applications", Antennas and Propagation Society International Symposium, 2005 IEEE, Jul. 3-8, 2005, pp. 483-486.

Takashi Ando, Junji Yamauchi and Hisamatsu Nakano, "Numerical Analysis of a Dielectric Rod Antenna Demonstration of the Discontinuity-Radiation Concept", IEEE Transactions on Antennas and Propagation, vol. 51, No. 8, Aug. 2003, pp. 2007-2013.

Ramadan A. Alhalabi and Gabriel M. Rebeiz, "High-Gain Yagi-Uda Antennas for Millimeter-Wave Switched-Beam Systems", IEEE Transactions on Antennas and Propagation, vol. 57, No. 11, Nov. 2009, pp. 3672-3676.

47 CFR § 15.257 Operation within the band 57-64 GHz.

A. A. Eldek. Design of double dipole antenna with enhanced usable bandwidth for wideband phased array applications, Progress in Electromagnetic Research, 2006, vol. 59, pp. 1-15, ISSN 1070-4698. (See pp. 3-5, 9 and figures 1. 6.).

Yang, H.Y.D. et al. 'Millimeter-wave antennas on a LTCC cavity'. In: Antennas and Propagation Society International Symposium (APSURSI). Chicago: IEEE, Jul. 8-14, 2012, pp. 1-2. (See col. 2, lines 38-47. col. 3. lines 1-18 and figures 1, 3.

Alhalabi E.A. et al, High-Gain Yagi-Uda Antennas for Millimeter-Wave Switched-Beam Systems. Antennas and Propagation. Nov. 2009. vol. 57. No. 11. pp. 3672-3676, ISSY 0018-926X. (See pp. 3673-3674 and figure 1.).

* cited by examiner

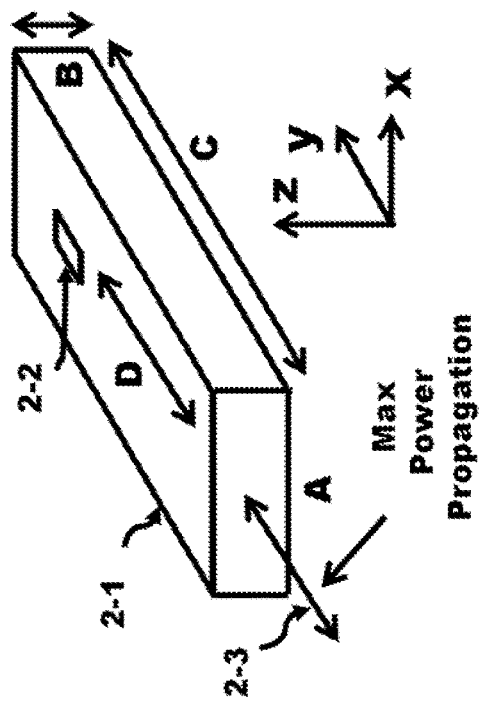
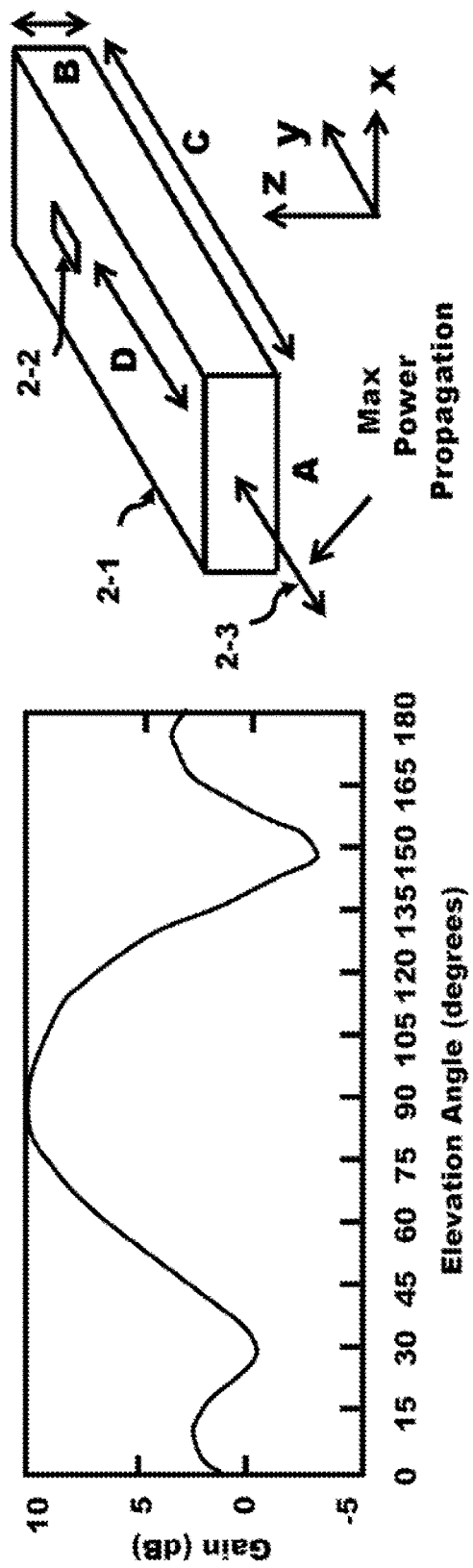
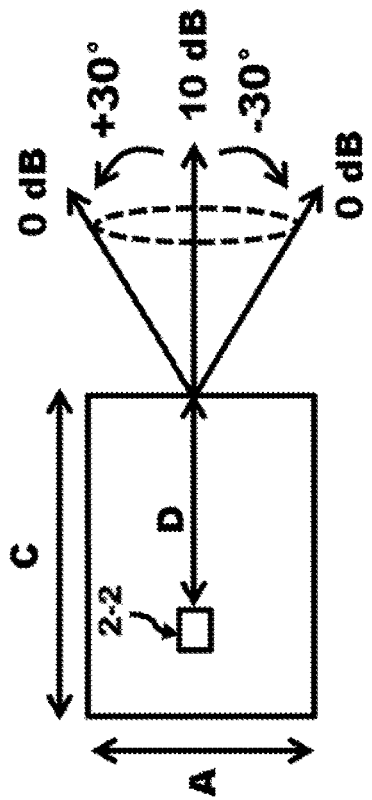
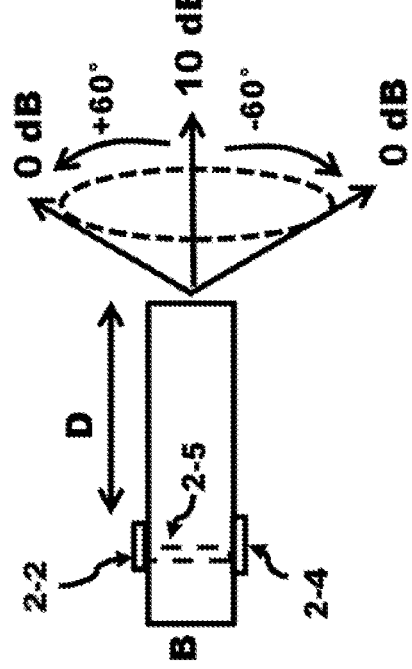
FIG. 2b
FIG. 2c
FIG. 2d
FIG. 2e

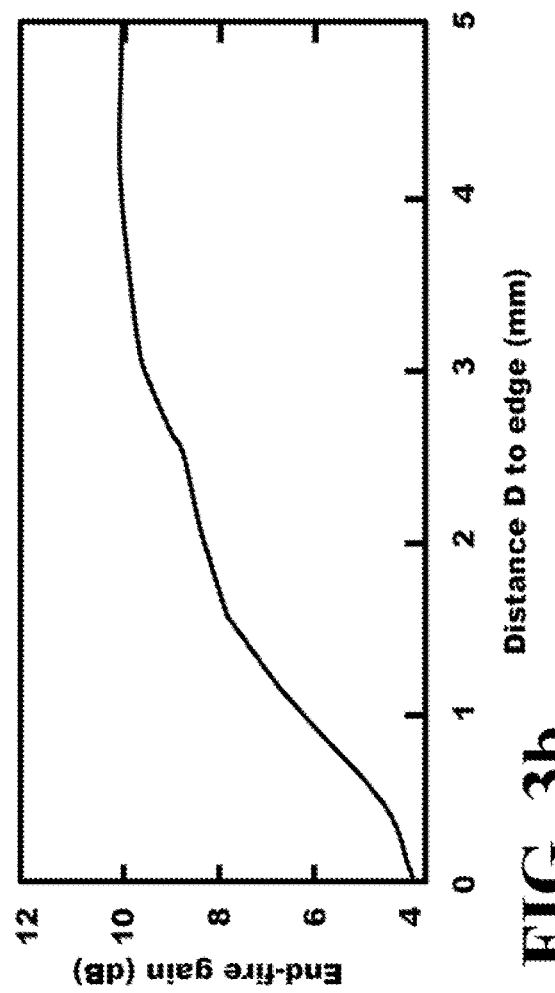
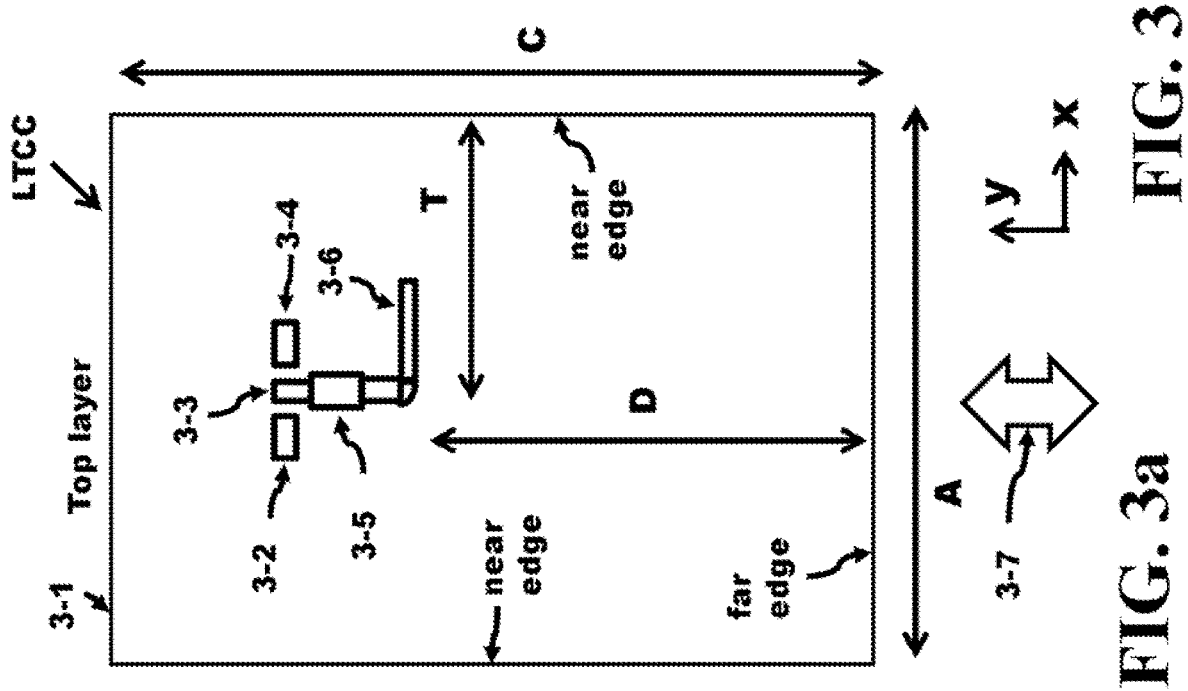
FIG. 3b
| Gain and Beam Variation versus Antenna Off-Center | | | |
|---|---|---|---|
| T (mm) | Main Beam (p) | End-fire gain (p =270) | |
| 2 | 270 | 9.8 | |
| 1.75 | 262 | 9.2 | |
| 1.5 | 256 | 8.3 | |
| 1.25 | 250 | 7.0 | |
| 1.0 | 244 | 5.4 | |
| 0.75 | 238 | 3.5 | |
FIG. 3c
FIG. 3a

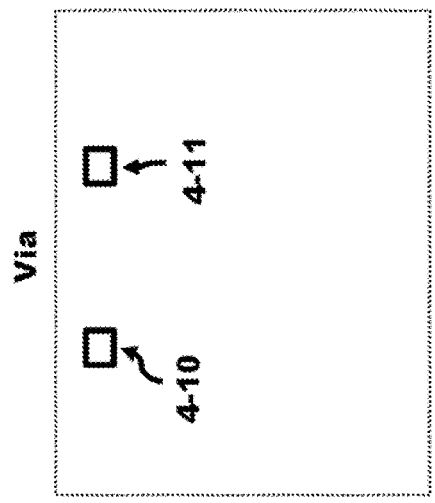
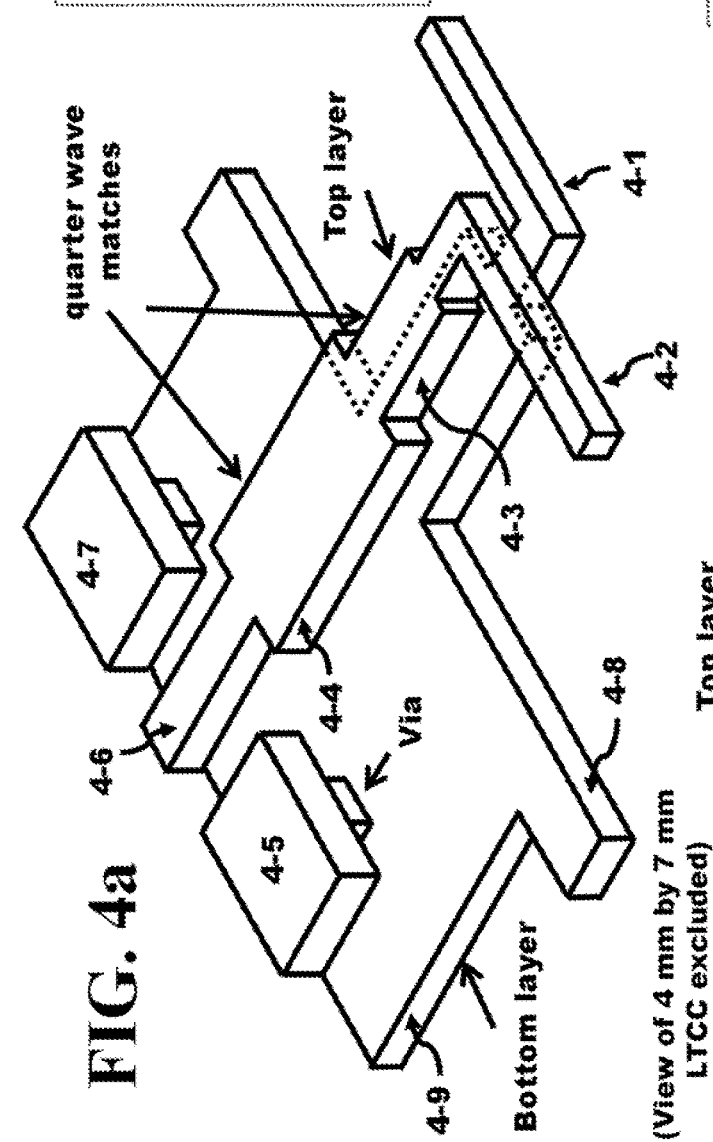
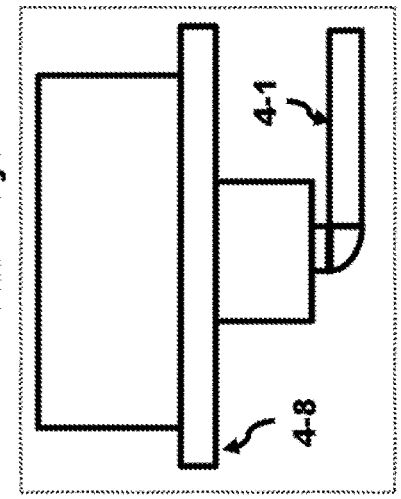
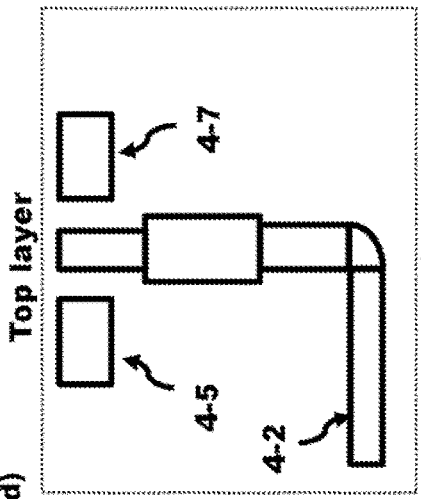
FIG. 4b
FIG. 4a
FIG. 4d
FIG. 4c

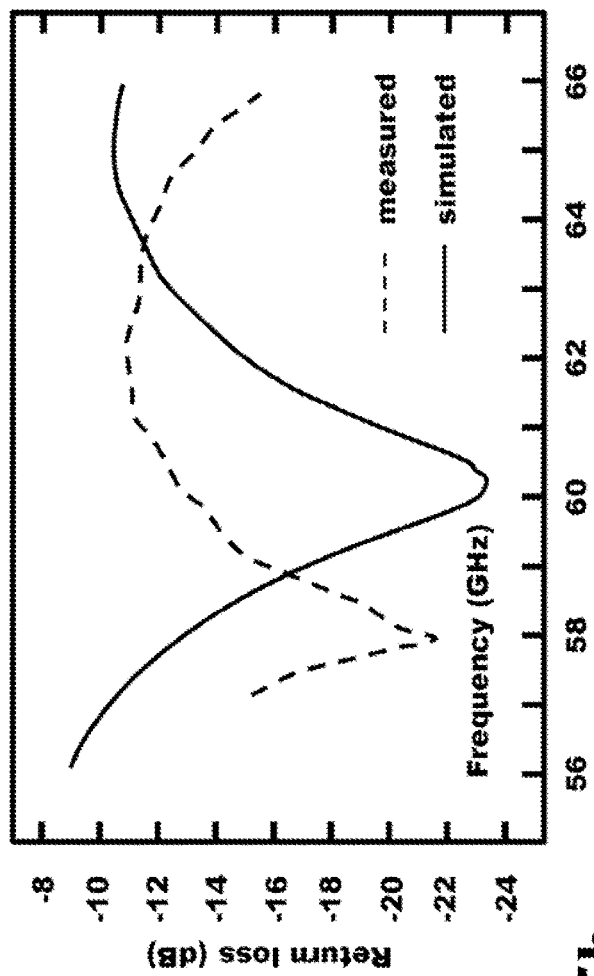
FIG. 5b
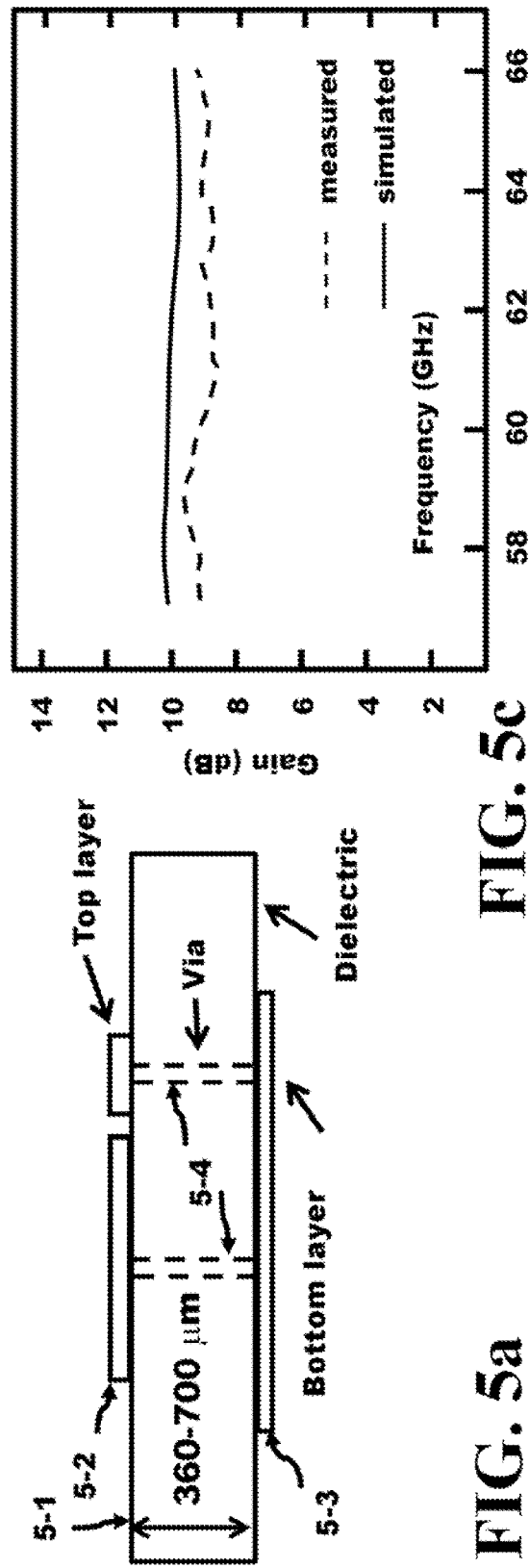
FIG. 5c
FIG. 5a

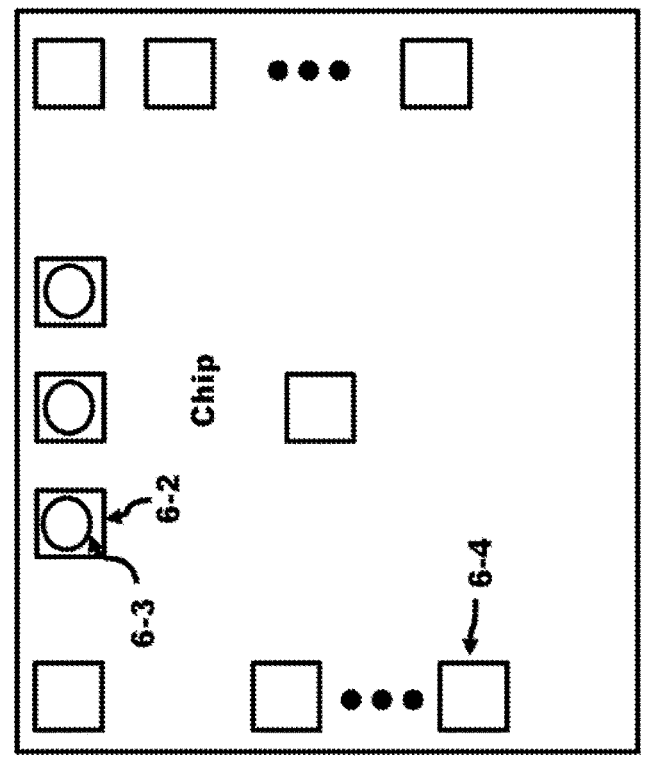
FIG. 6a
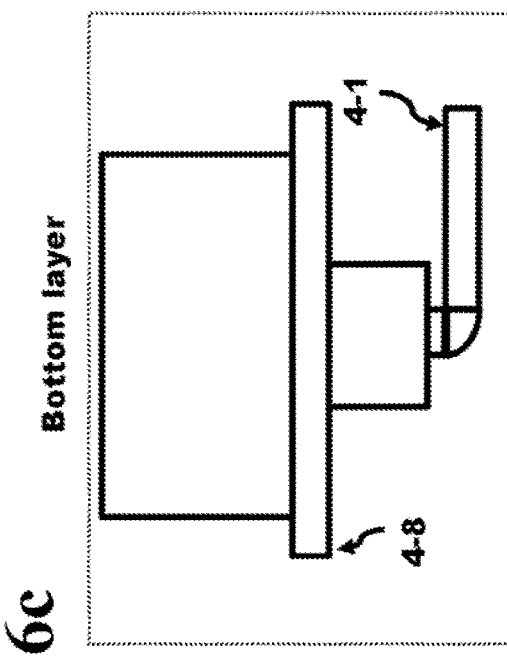
FIG. 6c
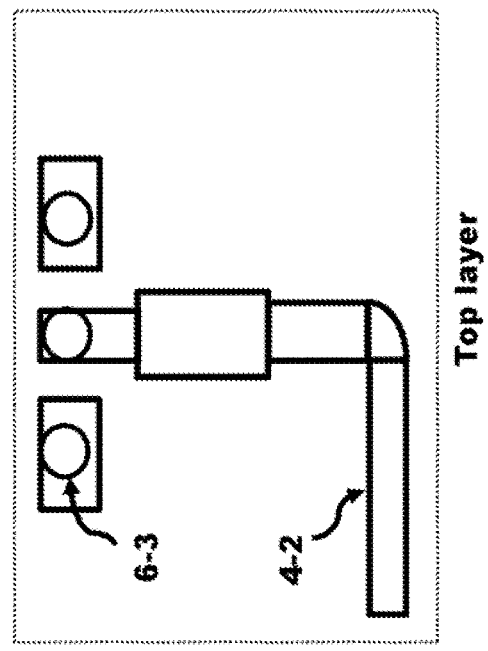
FIG. 6b
FIG. 6d

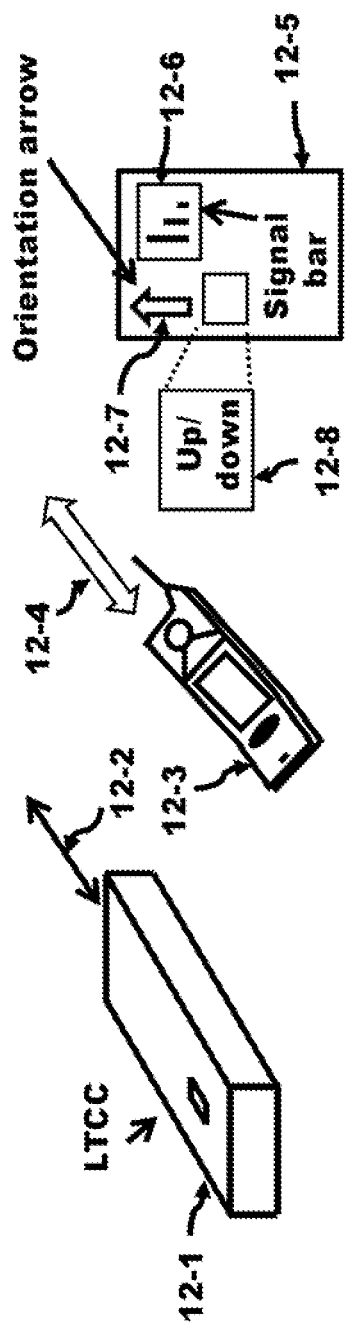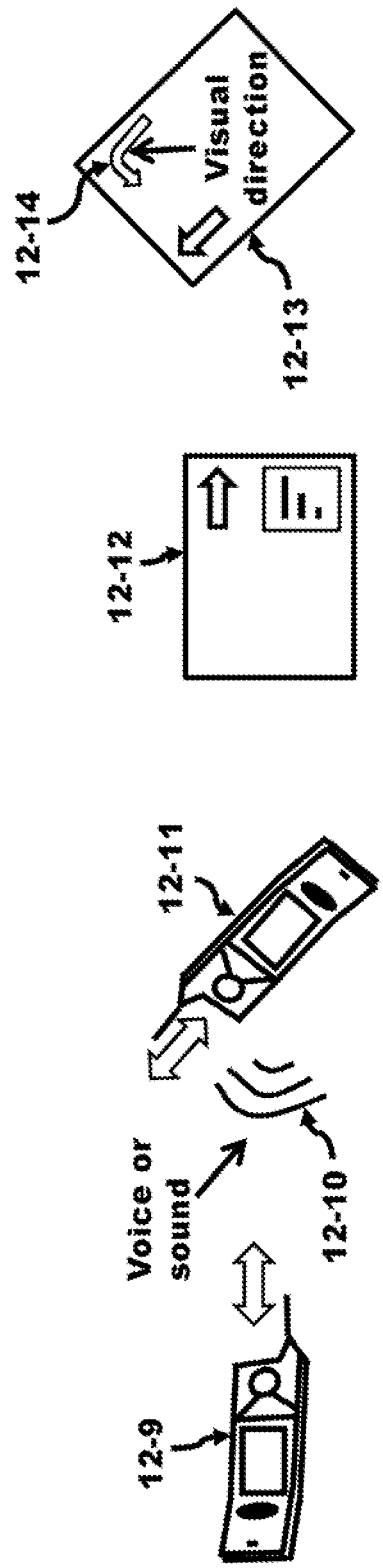
FIG. 12a
FIG. 12b
FIG. 12c

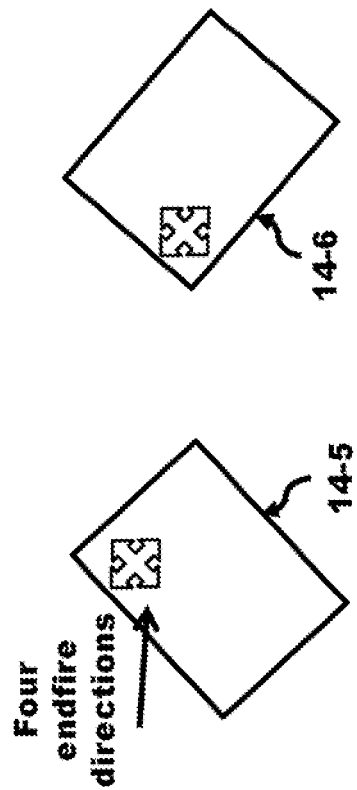
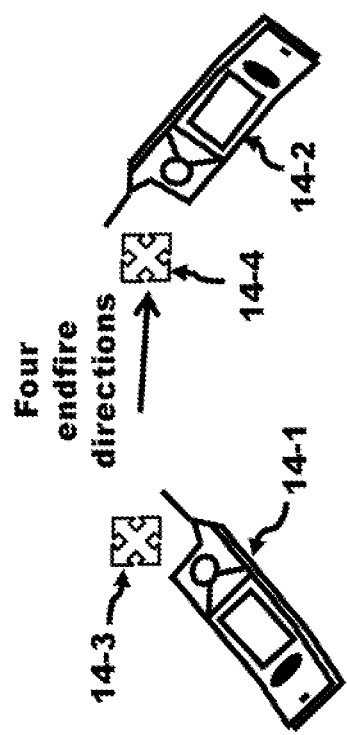
FIG. 14a
FIG. 14b
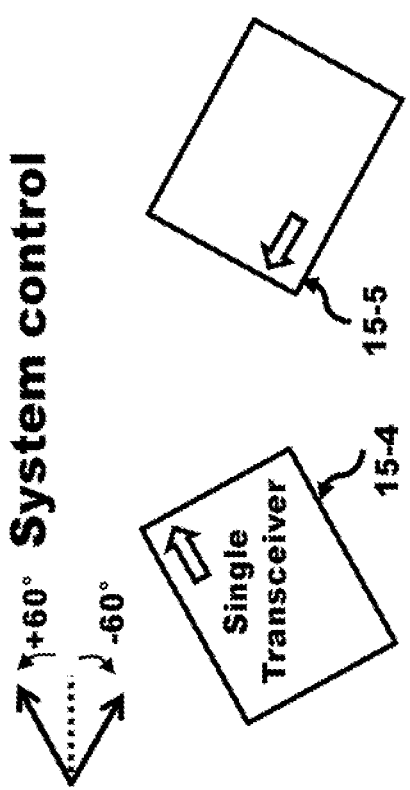
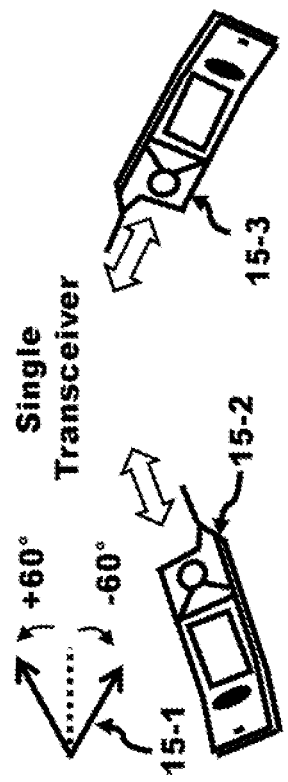
FIG. 15a
FIG. 15b

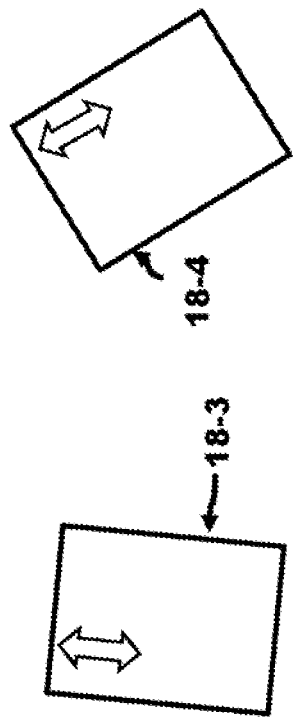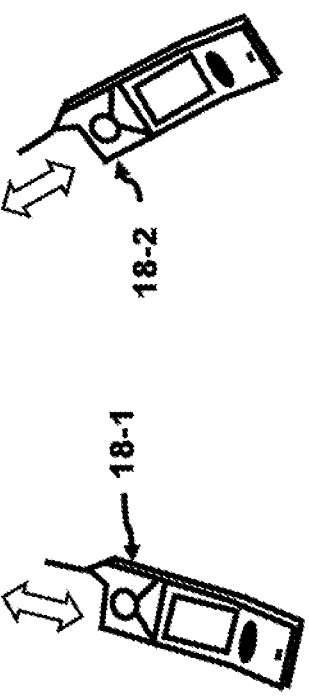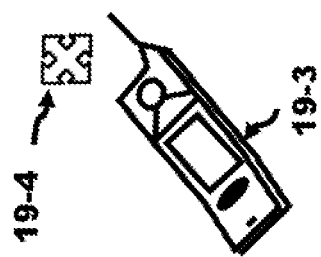
FIG. 18a
FIG. 18b
FIG. 19

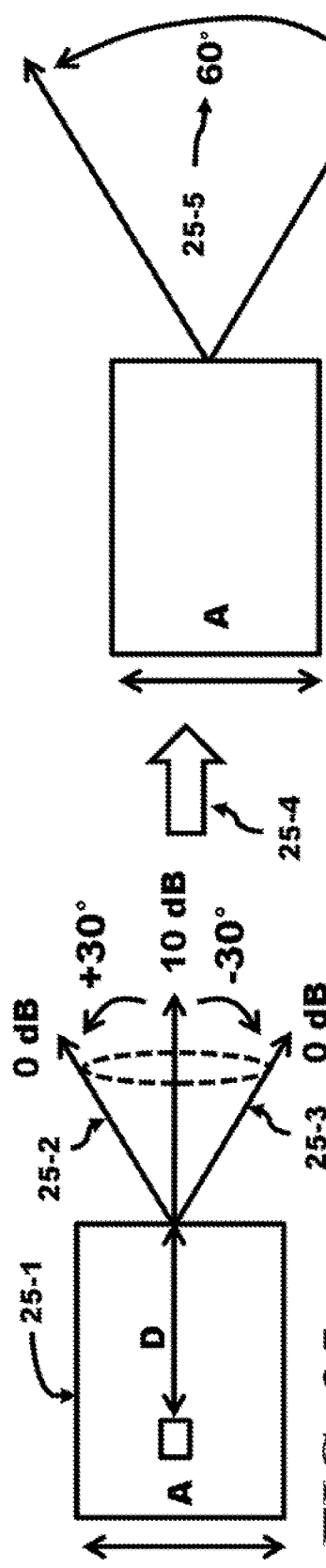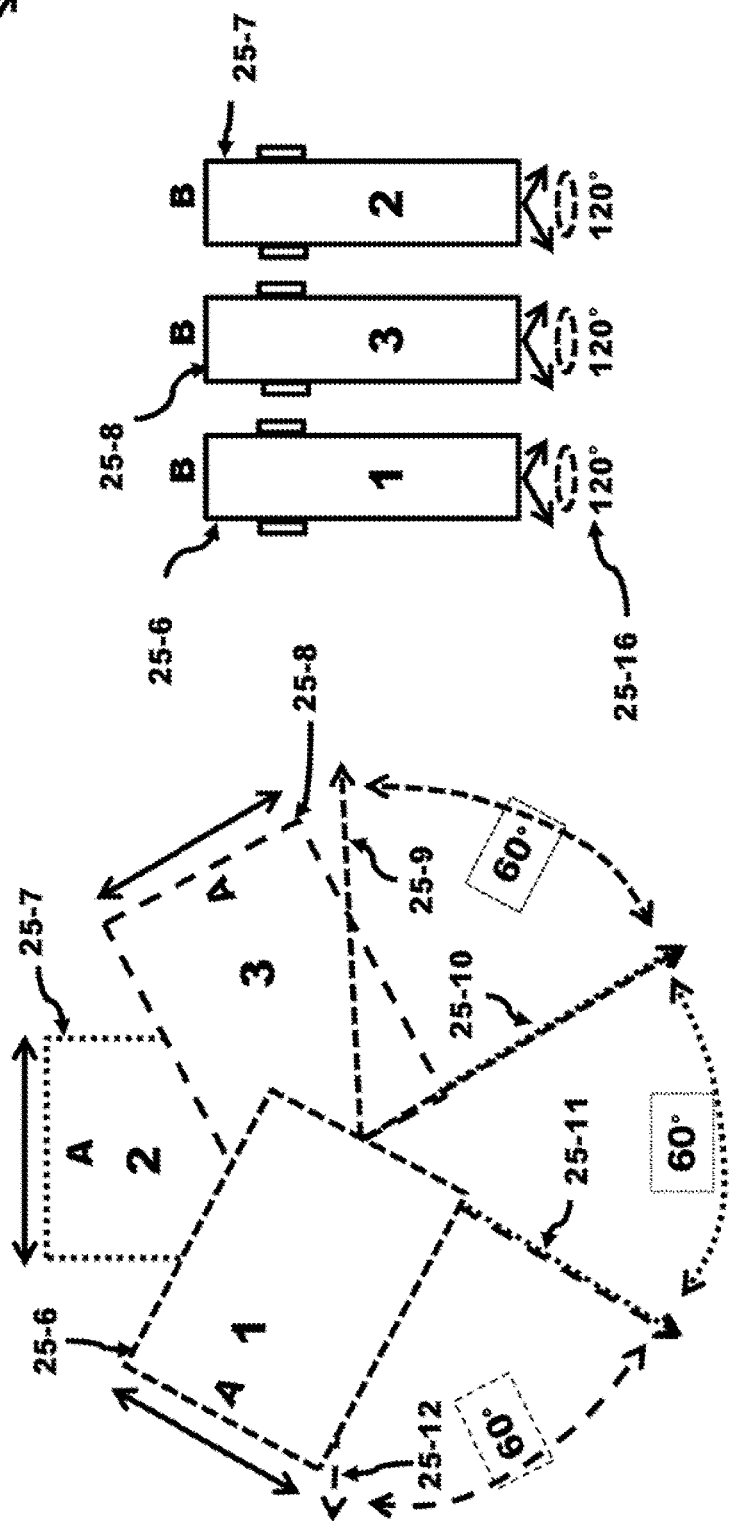
FIG. 25a
FIG. 25b
FIG. 25c

METHOD AND APPARATUS FOR A 60 GHZ ENDFIRE ANTENNA

CROSS-REFERENCE TO RELATED APPLICATIONS

The present application is related to the co-filed U.S. application Ser. No. 13/552,955 entitled "*Method and Apparatus for the Alignment of a 60 GHz Endfire Antenna*" filed on Jul. 19, 2012, which is assigned to the same assignee with at least one common inventor as the present application and incorporated herein by reference in their entireties.

BACKGROUND OF THE INVENTION

The Federal Communications Commission (FCC) has allotted a spectrum of bandwidth in the 60 GHz frequency range (57 to 64 GHz). The Wireless Gigabit Alliance (Wi-Gig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or GaAs (Gallium Arsenide) technology to form the dice in these designs.

CMOS (Complementary Metal Oxide Semiconductor) is the primary technology used to construct integrated circuits. N-channel transistors and P-channel transistors (MOS transistor) are used in this technology which deploys fine line technology to consistently reduce the channel length of the MOS transistors. Current channel lengths examples are 40 nm, the power supply of VDD equals 1.2V and the number of layers of metal levels can be 8 or more. This technology typically scales with technology and can achieve operation in the 60 GHz range.

Transceivers for the 60 GHz system have been formed in CMOS and comprise at least one transmitter and at least one receiver which are used to interface to other transceivers in a communication system. The transceivers receive or transmit electrical signals into the LNA or the power amplifier, respectively. These electrical signals are generated by or provided to an antenna. The antenna is a transducer that converts incoming electromagnetic energy from free space into electrical signals on the receive side of the transceiver or converts electrical signals into electromagnetic energy for transfer into free space.

Millimeter-wave integrated antennas for ultra-wide band (57-64 GHz band) applications need to have a low path loss, high antenna gain and large impedance bandwidth to provide sufficient link budget. Millimeter-wave integrated antennas had been well investigated in the past, such as tapered slot antennas (for example, see:), planar Yagi antennas (for example, see: R. A. Alhalabi and G. M. Rebeiz, "High-gain Yagi-Uda antennas for millimeter-wave switched-beam systems," *IEEE Trans. Antennas Propag.*, vol. 57, pp. 3672-3676, November 2009.), and dielectric rod antennas (for example, see: Takashi Ando, Junji Yamauchi, and Hisamatsu Nakano, "Numerical Analysis of a Dielectric Rod Antenna—Demonstration of the Discontinuity-Radiation Concept," *IEEE Trans. Antennas Propag.*, vol. 51, no. 8, pp. 2003-2007, August 2003.) for endfire radiation, or some of the more traditional patch or dipole antennas for broadside patterns. Normally, a high-gain millimeter-wave antenna can be a direct miniaturization of its lower frequency version. However, scaling integrated antennas where there are minimum trace width/gaps and vias pitch requirements on planar surfaces and substrate thickness requirements to support system weight considerations is difficult. For compact applications in portable units, the area allocated for antennas is rather small, further complicating the high-gain antenna design. Millimeter-wave integrated antennas also have resistive losses due to the skin effect. Other techniques are required to overcome these resistive losses and area resource allocations. In addition, the antenna must have a low return loss and be able to generate appreciable gain. A solution to overcome these problems is described.

Two additional critical design parameters of a millimeter-wave integrated antenna include power output and directionality. In the ultra-wide band (57-64 GHz band), the range of the transmitted signal is limited if the signal must be propagated uniformly from the antenna in comparison to having a highly directional antenna that focuses the output power in a particular direction. The focused power allows the transceiver to propagate the signals for a greater distance in a particular direction at the expense of reducing the signal transfer in other directions. This makes alignment between two transceivers more challenging. Several solutions are provided to overcome this shortcoming.

BRIEF SUMMARY OF THE INVENTION

The following is a summary and thus contains, by necessity, simplification, generalizations, and omission of detail; consequently, those skilled in the art will appreciate that this summary is illustrative only and is not intended to be in any way limiting. Various embodiments and aspects of the inventions, as defined by the appended claims, will be described with reference to details discussed below, and the accompanying drawings will illustrate the various embodiments. Numerous specific details are described to provide a thorough understanding of various embodiments of the present invention.

Scaling integrated antennas on a LTCC (Low Temperature Co-fired Ceramic) or materials with a high dielectric constant using trace width/gaps and vias pitch requirements on planar surfaces as well as altering the substrate thickness is a solution to overcome some of the previous mentioned difficulties. In addition, the placement of the metallization away from the edge of the substrate plays a vital role in increasing the gain.

An embodiment uses a microstrip fed dipole structure fabricated on a dielectric substrate to form a dielectric cavity resonator that channels the energy in the antenna. The dielectric constant of the substrate selected is greater than 5. The larger dielectric constant reduces the wavelength of the signal accordingly. Since the LTCC substrate has a dielectric constant that is usually quite high (5~8), the substrate thickness can be fabricated with a thickness between 360 µm to 700 µm. The large dielectric constant and thickness of the substrate creates a guiding wave in the LTCC to form an endfire antenna. The microstrip fed dipole structure uses a reflector placed with respect to the microstrip fed dipole structure and a ground plane to channel the energy within the dielectric in one particular direction.

Another embodiment is the placement of the microstrip fed dipole structure away from the edge of the substrate. As the microstrip fed dipole structure is moved from the edge of the substrate, the gain of the antenna increases. Placing the microstrip fed dipole structure in the center of the LTCC creates a dielectric cavity resonator that can generate a high gain signal (10 dB) in a preferred direction. This antenna structure is called an endfire antenna.

An additional embodiment is the positioning of a slot in the LTCC substrate between two microstrip fed dipole structures. One microstrip fed dipole structure can be used as an input antenna while the other is used as an output antenna. Without the slot, these two microstrip fed dipole structures have a strong coupling to each other causing the output beam to tilt away from the ideal endfire direction. The creation of a slot in the LTCC substrate between the two microstrip fed dipole structures eliminates the beam tilting and allows for the two microstrip fed dipole structures to reduce the coupling to each other thereby providing substantially two isolated endfire antennas. These antennas can be used to create a channel with a full-duplex mode. The full-duplex mode uses one antenna to receive a first signal while the second antenna is used to transmit a second signal.

A further embodiment is the positioning of a slot in the LTCC substrate between every adjacent microstrip fed dipole structures. These microstrip fed dipole structures can be used as an input antennas, output antennas or a combination of inputs and outputs. Without the slots, the microstrip fed dipole structures would have a strong coupling to each other causing the output beams to interact with one another and prevent ideal endfire propagation. The creation of a slot in the LTCC substrate between the microstrip fed dipole structures eliminates the non-ideal behavior and allows the microstrip fed dipole structures to reduce the coupling to each other thereby providing substantially isolated endfire antennas. These antennas can be used as multiple receive and/or multiple transmit antennas, such used in MIMO (Multiple Input Multiple Output) systems.

Another embodiment is marking or identifying the preferred direction of the antenna within a portable unit. An arrow can be positioned onto the case of the portable unit or laptop aligned with the direction of the endfire antenna. Another variation is to present an arrow on a display screen indicating the orientation of the endfire antenna within the portable unit. Each user can use their arrow to align their device to the other user's device after placement of their devices on a flat parallel surface. When the two arrows are aligned to point at each other, a communication channel is formed.

A further embodiment is to measure the strength of the communication channel and use either a visual or audio feedback signal that the user can use to further correct the alignment. The visual display can be shown on the screen of the device to rotate the device one way or the other, while the audio message instructs the user to move the device to improve the link.

Yet another embodiment is to have a device mounted on a rotatable platform in a ceiling apparatus to adjust the communication channel to a stationary portable unit with an endfire antenna automatically. The ceiling units can consist of an array of endfire antennas distributed over the surface of the ceiling and each mounted on a rotatable platform. The user points their portable device towards the ceiling and the system controlling the ceiling units selects and adjusts the positioning of a rotatable unit to point the endfire antenna to the portable unit to make the optimum communication channel.

Another embodiment is to have the devices on a rotatable platform to adjust the communication channel automatically. The system can rotate one device through a full 360° rotation and then rotate the second device a portion of an angle and redo the 360° rotation until a strong communication channel is established. Such a system can have applications in collision avoidance systems for automobiles or for transferring data between two moving objects.

Another embodiment uses several transceivers mounted together rotationally offset by 60° to provide a 180° coverage in an azimuth direction and 120° in an elevation direction. These units can be mounted as an array in a ceiling apparatus. The user points their portable unit towards the ceiling and the system controlling the ceiling arrays selects one of the three transceivers in one of the arrays to make the optimum communication channel to the portable unit.

Yet another embodiment is to have the system include the integration of power management features. For example, 1) shutting down the 60 GHz in favor of Wi-Fi if the user chooses to be directionally inactive with the endfire antenna design, or 2) terminating directional arrows and voice instructions when the user's environment enables the ceiling mounted 3D transmitter to provide an adequate 60 GHz link.

Another embodiment is providing four antennas on one LTCC substrate each pointing in different quadrants. The entire circular region would be covered allowing two devices to communicate with each other. Then, a selection process can be employed to disable three of the antennas and corresponding transceivers that do not aid in establishing the communication channel thereby saving power.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 2b illustrates the measured gain of the endfire antenna in a vertical (elevation) direction where 90° is the horizontal plane in accordance with the present invention.

FIG. 2c shows a 3-D representation of the LTCC substrate with the metallization of the antenna indicating maximum power propagation in accordance with the present invention.

FIG. 2d presents a view along the x-direction of the endfire antenna with the angular extent of the 0 dB range in accordance with the present invention.

FIG. 2e depicts a view along the negative z-direction of the endfire antenna with the angular extent of the 0 dB range in accordance with the present invention.

FIG. 3a illustrates a close up of the top side of an endfire antenna with the metallization in accordance with the present invention.

FIG. 3b shows the gain of the endfire antenna as function of the metalized distance from the far edge in accordance with the present invention.

FIG. 3c presents a table of the endfire gain as a function of distance from the near edge in accordance with the present invention.

FIG. 4a illustrates a 3-D diagram of the metallic portion of another endfire antenna in accordance with the present invention.

FIG. 4b depicts the metallization layer of the vias of the LTCC substrate in the endfire antenna in accordance with the present invention.

FIG. 4c shows the metallization layer of the top layer of the LTCC substrate in the endfire antenna in accordance with the present invention.

FIG. 4d presents the metallization layer of the bottom layer of the LTCC substrate in the endfire antenna in accordance with the present invention.

FIG. 5a depicts a cross-section view along the x-direction of the endfire antenna in accordance with the present invention.

FIG. 5b illustrates the return loss of the endfire antenna as a function of the frequencies of 56-67 GHz in accordance with the present invention.

FIG. 5c shows the gain of the endfire antenna as a function of the frequencies of 56-67 GHz in accordance with the present invention.

FIG. 6a presents a cross-section view of the LTCC and chip (or die) including the solder bumps in accordance with the present invention.

FIG. 6b illustrates the metallization layer of the top layer of the LTCC substrate in the endfire antenna in accordance with the present invention.

FIG. 6c depicts the metallization layer of the chip including the solder bumps in accordance with the present invention.

FIG. 6d shows the metallization layer of the bottom layer of the LTCC substrate in the endfire antenna in accordance with the present invention.

FIG. 12a shows the orientation of the endfire antenna in an LTCC, portable unit and display screen in accordance with the present invention.

FIG. 12b presents the audio adjust without using the display screen in accordance with the present invention.

FIG. 12c depicts the screen adjust of aligning the portable units with endfire antennas together in accordance with the present invention.

FIG. 14a shows two portable units using a four quadrant endfire antenna with unknown orientation in accordance with the present invention.

FIG. 14b presents the display screens presenting the four endfire directions in accordance with the present invention.

FIG. 15a illustrates two portable units each in a moving object and using a single endfire transceiver on rotatable platforms with unknown +/−60° orientation in accordance with the present invention.

FIG. 15b illustrates the display screens each in a moving object and using a single endfire transceiver on rotatable platforms with unknown +/−60° orientation in accordance with the present invention.

FIG. 18a depicts two portable units each using a single endfire transceiver on rotatable platforms with unknown orientation in accordance with the present invention.

FIG. 18b illustrates the display screens each using a single endfire transceiver on rotatable platforms with unknown orientation in accordance with the present invention.

FIG. 19 shows two portable units using a four quadrant endfire antenna with unknown orientation in accordance with the present invention.

FIG. 25a depicts a view from the top of the endfire antenna with the angular extent of the 0 dB range showing a 60° spread in accordance with the present invention.

FIG. 25b illustrates three endfire transceivers each offset by 60° in accordance with the present invention.

FIG. 25c shows the side view of three endfire transceivers each with a 120° extent in accordance with the present invention.

DETAILED DESCRIPTION OF THE INVENTION

Figure 1:
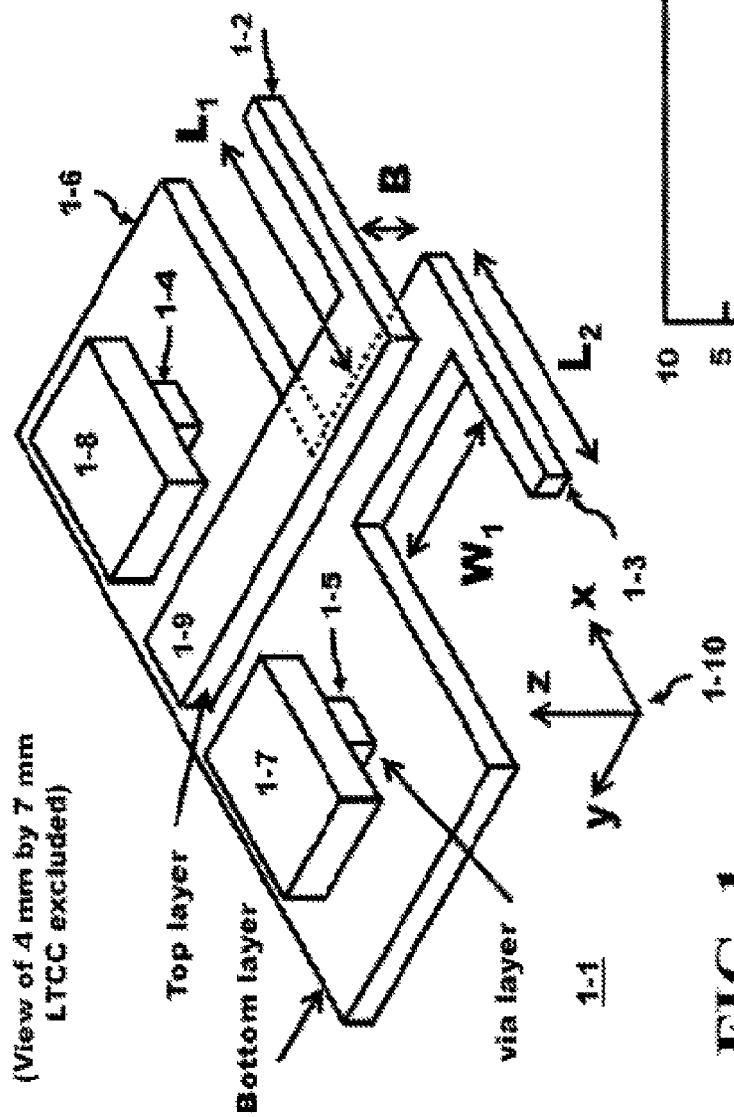
FIG. 1 depicts a 3-D diagram of the metallic portion of the endfire antenna in accordance with the present invention.

FIG. 1 illustrates the geometry 1-1 of a microstrip-line fed dipole of a split dipole between a top and bottom layers of metallization on an LTCC substrate. The top layer consists of the metal trace 1-9 and the first half of the dipole 1-2 which has a length $L_1$. In addition more metal pads 1-7 and 1-8 are located in the top layer. The pads 1-7, 1-8 and the end of 1-9 are the locations where the top layer is solder bumped to a chip. The bottom layer is shown as 1-6 which is the reflector and a length of wire that is $W_1$ units long connected to the second half of the dipole 1-3 which has a length $L_2$. The length of the microstrip-lines (from dipole to the feed point) serves as impedance transformer. The Cartesian coordinate system is illustrated in 1-10 is provided to present the direction of propagation of the antenna. The reflector (or ground patch) and spacing to the dipole are chosen to minimize the radiation in the y-direction or 90° measured with respect to the x-axis. The separation between the top layer and the bottom layer is illustrated by the height B. The vias 1-5 and 1-4 connect portions of the top layer to the bottom layer.

The table in 1-11 indicates that the height B ranges in thickness from 0.36 mm to 0.7 mm. The vias are fabricated in the LTCC substrate (the substrate is not illustrated). The LTCC substrate has a height equal to B that can range from 360 μm to 700 μm and with an approximate width and length dimension of 4 mm×7 mm, respectively. The dimension $L_1$ of the upper dipole is 0.58, the dimension $L_2$ of the lower dipole is 0.47 mm, and are designed to resonate at 61 GHz. The overall dipole dimension is approximately 1.05 mm while the distance from the dipole to the reflector $W_1$ is 0.59 mm. The placement of the dipole and the reflector 1-6 determines the propagation of the waveform which would be in the minus y-direction or 270° measured with respect to the x-axis. The endfire direction is in the direction of the far side of the board.

There are several distinct features of this geometry. First, the dipole is spread into two different layers. This necessity comes from the limitation on the metallic trace spacing in the LTCC substrate. If the two dipole arms are coplanar, the coplanar fed line spacing would be too wide to form a suitable transmission line. Second, the patch on the backside 1-6 serves as both the ground for the microstrip-line and as a reflector. The dimensions of the design are based on HFSS (High-Frequency Structure Simulator) simulations.

Figure 2A:
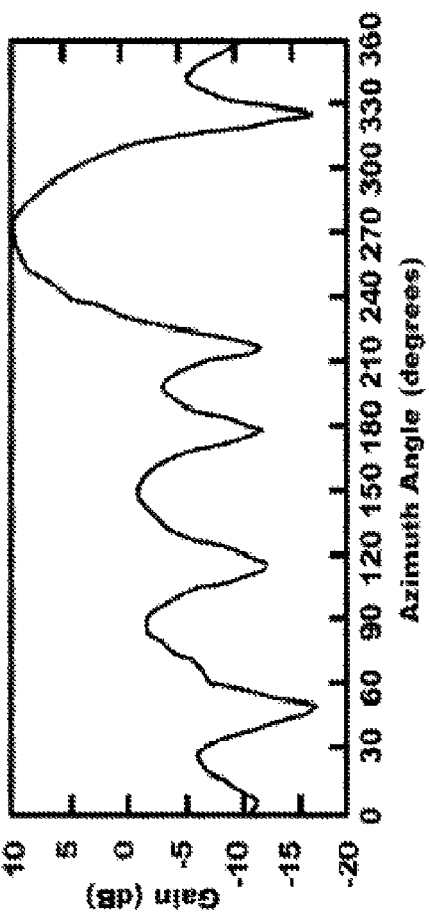
FIG. 2a illustrates the measured gain of the endfire antenna in a horizontal (azimuth) direction in accordance with the present invention.

FIG. 2a presents a plot of the measured azimuth angle gain at 61 GHz of the endfire antenna over a 360° azimuth angle spread. The maximum occurs at 270° (in the negative y-direction) with a gain of 10 dB. As the measurement shifts clockwise or counterclockwise the gain decreases on both sides and reaches 0 dB at approximately 240° and 310°.

FIG. 2b depicts a plot of the measured elevation angle gain at 61 GHz for an azimuth of 270°. A 90° elevation angle corresponds to a vector along the negative y-axis. As the vector is rotated about the origin in a positive z-direction, the elevation angle increases until the angle is 180° which is co-linear with the positive z-axis. As the vector is rotated about the origin in a negative z-direction, the elevation angle decreases until the angle is 0° which is co-linear with the negative z-axis in a plane which is parallel to the height and width of the LTCC substrate dielectric. As the elevation increases to 135° or decreases the 45° the gain drops off to about 0 dB.

FIG. 2c illustrates the power flow from an LTCC substrate co-linear with the negative y-direction. The top layer of the metallization pattern of the dipole is within the region 2-2. This metallization 2-2 has been deposited on the top side of the LTCC substrate. The reflector is deposited on the bottom side which is not shown. The LTCC substrate has a thickness B ranging from 0.35 mm to 0.7 mm, the width of the substrate is A and is approximately 4 mm and the length of the substrate is C and is about 7 mm. The first half of the dipole 2-2 is located a distance D from the far edge of the substrate. Under these conditions, the maximum power propagation occurs in the direction 2-3 which is in the negative y-direction called the endfire direction, as mentioned earlier. About 10 dB endfire antenna gain is observed for a dipole with a reflector. Such a high gain is clearly due to the dielectric cavity effects. The LTCC substrate acts like a waveguide directing radiation in the endfire direction. The structure is more or less like a dielectric rod antenna with a dipole feed. It demonstrates that a small LTCC board can be a very effective endfire radiator.

In FIG. 2d, a view of FIG. 2c in the positive x-direction is illustrated. In this figure, the thickness of the LTCC substrate is B, the first half of the dipole 2-2 is located a distance D from the far edge while the second half of the dipole is fabricated on the bottom of the substrate at 2-4. The maximum power propagation is illustrated as 10 dB emitted from the far edge to the right and as the elevation increases 60° or decreases by 60°, the power output decreases to 0 dB. FIG. 2e illustrates a view of FIG. 2c in the negative z-direction. The LTCC substrate has a width of A and a length of C which is equal to 4 mm and 7 mm, respectively. The pattern of the top half of the dipole is within the metallization region 2-2 and a maximum energy output emitted from the far edge is at 10 dB as indicated by the horizontal line on the right. As the azimuth changes plus or minus 30°, the power output drops down to 0 dB.

A close-up of FIG. 2e is illustrated in FIG. 3a. The near edge and far edge are defined in FIG. 3a. The near edges of the LTCC substrate are those edges parallel with the y-axis. The far edge of the LTCC substrate is the edge in the negative y-direction which is parallel with the x-axis. The metallization illustrated on the top layer is where the bonding solder bump pads are located at 3-2, 3-3 and 3-4. A quarter wavelength matching pattern 3-5 is inserted between 3-3 and the first half of the dipole 3-6. The dipole antenna is located between the two near edges of the LTCC substrate 3-1 where A equals 4 mm. A 10 dB antenna gain in the endfire direction is observed when the dipole is placed a distance D equal to 4 mm from the far edge of the LTCC substrate. The cavity resonant mode of most interest is similar to the TE (Transverse Electric) even mode of a dielectric slab, where the E field is polarized in the direction of dipole arms. From transmission line theory, it is evident that the antenna placement within the LTCC board will have significant impact on the endfire antenna gain due to the radiation discontinuity. As D is decreased from 4 mm towards 0 mm, the waveform in FIG. 3b illustrates how the endfire gain is decreased. The closer the dipole 3-6 is moved towards the far edge then the gain of the endfire decreases until the dipole 3-6 is located at the far edge and drops to almost 4 dB. The endfire gain versus the distance from dipole to the far edge is shown in FIG. 3b. When the distance D is zero, the dipole is right at the far edge of the board, the cavity effect is minimum and the gain drops to that of a normal dipole antenna (with some back reflection 4-5 dB).

The table in FIG. 3c illustrates the effect of decreasing the distance T of the dipole 3-6 towards the near edge of the LTCC substrate 3-1 when D equals to 4 mm. For T equal to 2 mm, the dipole is located in the center of the LTCC substrate between the near edges when A equals 4 mm. The main beam 3-7 is located at 270° measured with respect to the x-axis and the endfire gain is approximately 10 dB. As depicted in FIG. 3c, when T decreases to 1.25 mm, the dipole becomes off-centered in the LTCC substrate. The main beam now exits the substrate at 250° but only has a gain of 7 dB. Finally as T is decreased to 0.75 mm, the main beam points at 238° and only has a gain of 3.5 dB. For maximum gain, the dipole should be located away from the near edges of the LTCC substrate equally. For example, T should be 2 mm when A is 4 mm to achieve a 10 dB gain from the endfire antenna fabricated on an LTCC substrate.

The LTCC substrate has a large dielectric ranging anywhere from 5 to 8 which is a dielectric value that has not been used in previous endfire designs. The combination of the large dielectric value of the substrate and the location of the dipole being away from the near and far edges of the LTCC substrate 3-1 provides a substantial gain in the system. It is interesting to see that when the dipole-edge distance is sufficiently large (>one guided-wave length), the gain increase is almost saturated. This effect can be explained with the use of sections of transmission line of different characteristic impedances. The antenna placement is equivalent to an impedance matching problem.

In practical applications, the antenna may not be centered on the LTCC substrate. When the dipole is off center, the cavity mode resonate in the transverse direction will be excited. In effect, there will be two cross-over cavities modes. As a result, there is major radiation in both planar directions. As the dipole moves towards one of the near edges, the main beam shifts toward the opposite side and the endfire gain drops significantly. When the dipole almost touches the near edge, the endfire gain is only about 3.5 dB.

As discussed earlier, a dipole antenna on a LTCC board with a backside patch acting as a reflector and ground for a microstrip feed and the dipole properly placed between the near and far edges enhances endfire gain significantly. The LTCC substrate with a large dielectric value acts as a dielectric cavity providing a gain of up to 10 dB which is easily achievable. However, care must be taken for antenna placement. If the dipole moves closer to a substrate edge, the endfire gain becomes much worse. The best results were found for the case when the dipole is centered between the near edges and at least 1 wave-guided length from the far edge in the endfire direction.

FIG. 4a illustrates another pattern of a dipole on the top and bottom layer of an LTCC substrate with a dimension of 4 mm×7 mm which is not shown in this figure. The top layer consist of the bonding pad 4-5, 4-6 and 4-7 and the traces 4-4 and 4-3 are quarter wave matching traces while the last pattern on the top layer is one half of the dipole 4-2. The bottom layer consists of the reflectors 4-9 and 4-8 including the interconnect trace to the second half of the dipole 4-1. Finally, the top and bottom layers are connected by the use of vias connected to the solder bump pads 4-5 and 4-7. FIG. 4b illustrates the pattern of the vias 4-10 and 4-11. FIG. 4c provides the pattern of the top layer showing the bonding pads 4-5 and 4-7 and first half of the dipole antenna 4-2. FIG. 4d presents the bottom layer patterning consisting of the reflector 4-8 and the second half of the dipole 4-1. The dual arrows indicate that the direction of communication signals can be going in and out of the LTCC substrate.

FIG. 5a illustrates a cross section of the LTCC substrate 5-1 with the top and bottom metallization layers 5-2 and 5-3. The vias 5-4 are illustrated in and the thickness of the LTCC substrate ranges from 360 µm to 700 µm. FIG. 5b illustrates the measured and the simulated return loss of the LTCC substrate over a range of frequencies from 56 GHz to 66 GHz. Over this entire range, the measured return loss is better than −10 dB which is an excellent result. The measured result is shifted from the simulated result because of the three sigma spread process variations of the board fabrication and of the metallization variation of the top and bottom layers. In FIG. 5c, the gain at 270° over the range of frequencies from 58 GHz to 66 GHz illustrating that the measured and simulated gains are very close to 10 dB.

FIG. 6a illustrates the endfire antenna fabricated on an LTCC substrate 5-1 solder bumped 6-3 to a chip 6-1 or die. The bumps connect the top layer of the LTCC substrate metallization pattern to the chip pads 6-2. A trace of the top layer of the LTCC substrate is illustrated in FIG. 6b. The location where the solder bump 6-3 will be placed is illustrated within the bonding region while half of the dipole 4-2 is also illustrated. In FIG. 6c, a top view of the chip with an array of solder bump pads 6-2 and 6-4 are illustrated. The other solder bump pads are not labeled and the remaining solder bumps are not shown. Illustrated within one of the solder bump pads 6-2 is a solder bump 6-3 which is used to connect to the LTCC substrate. Finally, in FIG. 6d, the bottom layer of the LTCC substrate 5-1 is illustrated, providing the view of the reflector 4-8 and the second half of the dipole antenna structure 4-1.

Figure 7:
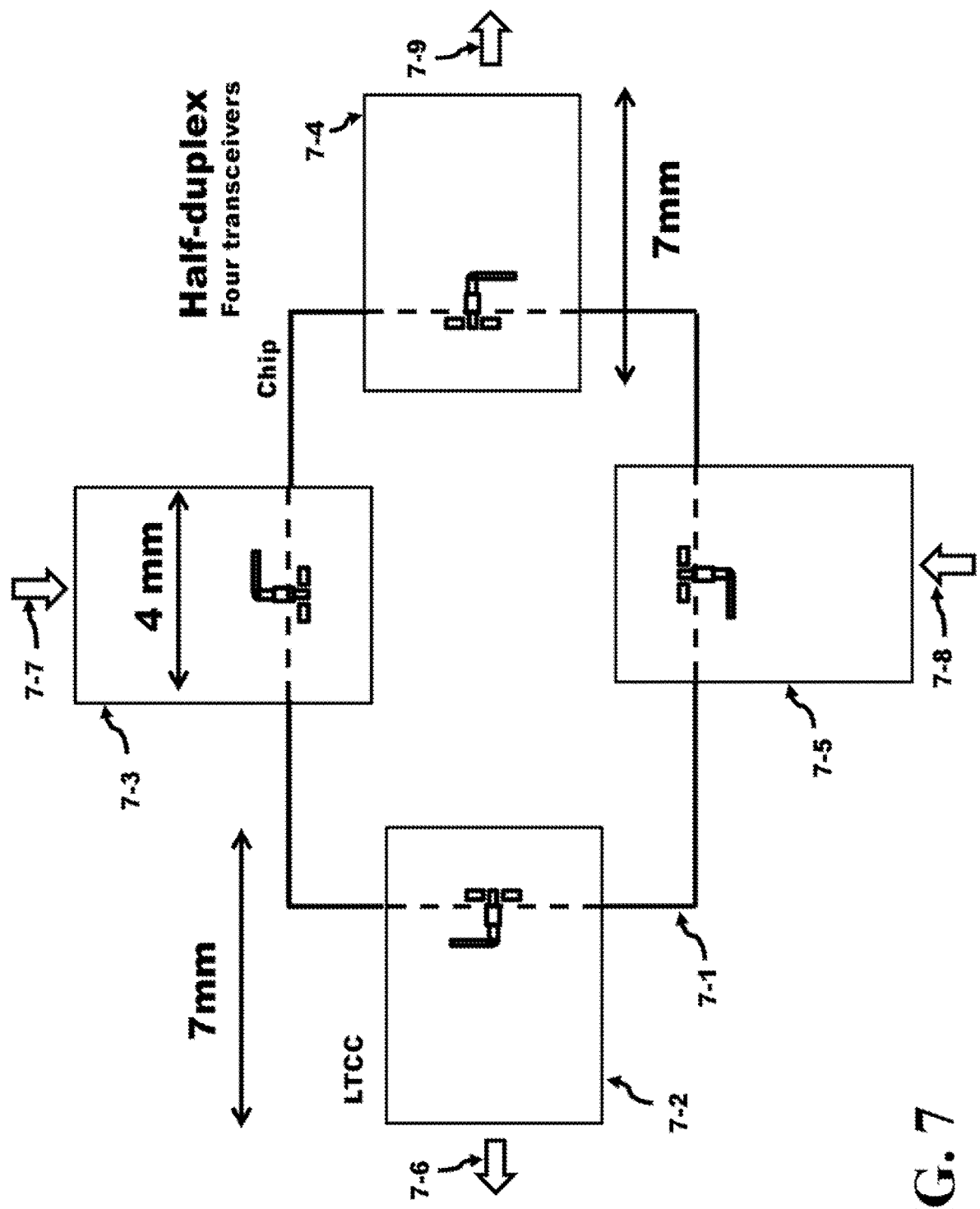
FIG. 7 presents a top view of several LTCC endfire antennas solder bumped to a chip in accordance with the present invention.

FIG. 7 illustrates a top view of separate LTCC substrates (7-2, 7-3, 7-4 and 7-5) solder bumped to a chip 7-1. Each of the LTCC substrates is 7 mm×4 mm to insure a large gain and they can be designed to operate at the same frequency or at different frequencies. In this particular case, input signals 7-7 and 7-8 are arriving on the LTCC of 7-3 and 7-5, respectively, and output signals 7-6 and 7-9 are emitted from the output of the LTCC substrates 7-4 and 7-6, respectively. Different combinations of input/output configurations are possible and all of these could operate at the same frequency, if desired. Another possibility is to have all of the dipole antennas fabricated on one LTCC substrate. In addition, this circuit can operate in a half-duplex mode; that is, when an endfire antenna is in a receiving mode an RF switch internal to the chip can couple the antenna to a transmitter to make that endfire antenna a transmitter. An additional possibility for this system is to listen for 60 GHz signals on all antennas since coverage over the full azimuth direction is possible, then after finding a 60 GHz signal on one of the four antennas, disabling the other three transceivers and corresponding antennas to save power.

Figure 8:
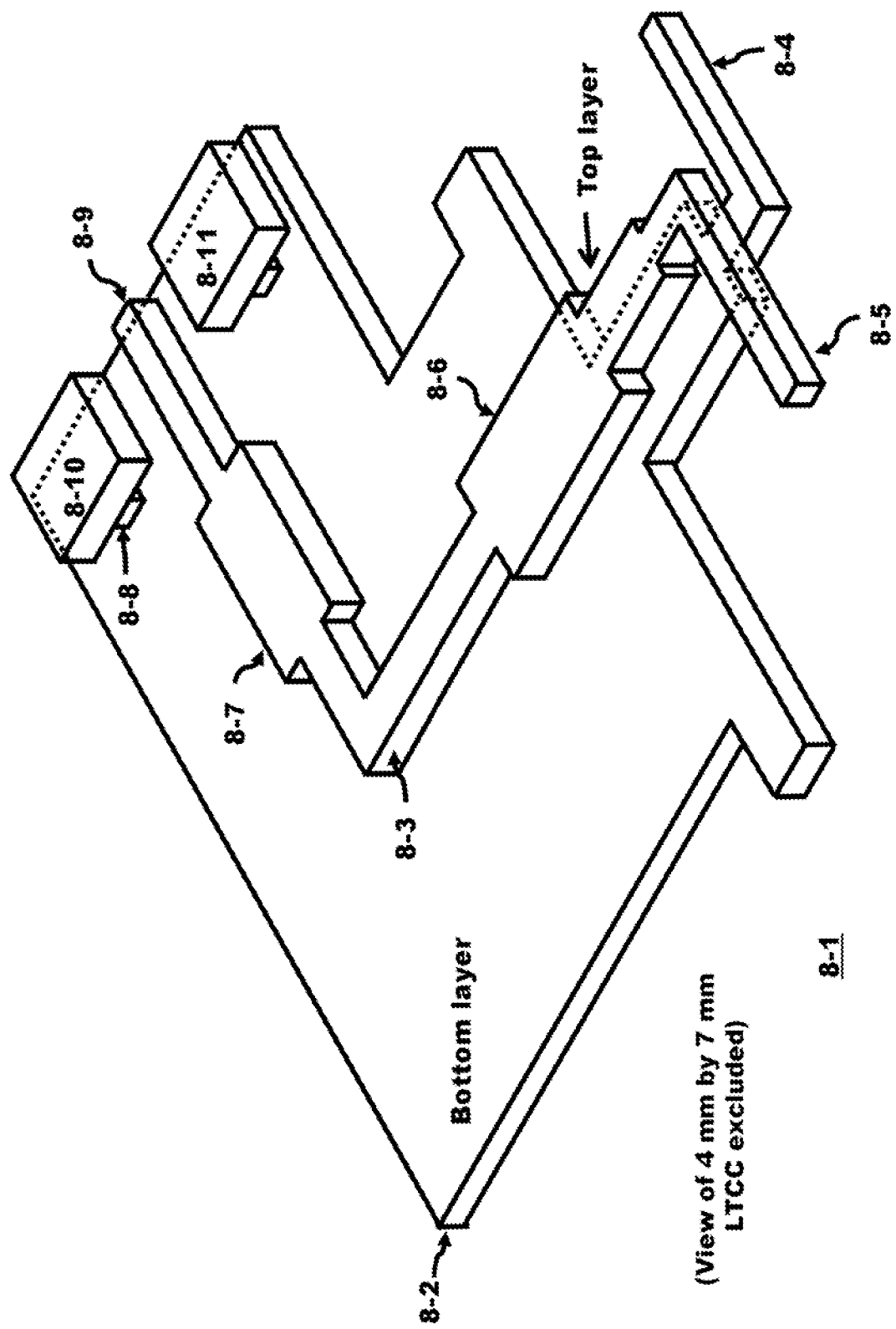
FIG. 8 depicts a 3-D diagram of the metallic portion of yet another endfire antenna in accordance with the present invention.
Figure 9B:
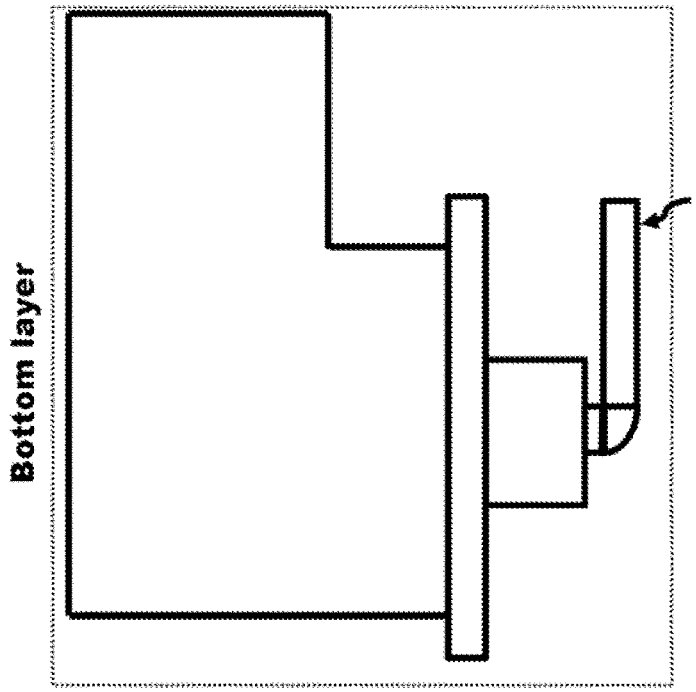
FIG. 9b shows the metallization layer of the bottom layer of the LTCC substrate in the endfire antenna of FIG. 8 in accordance with the present invention.
Figure 9A:
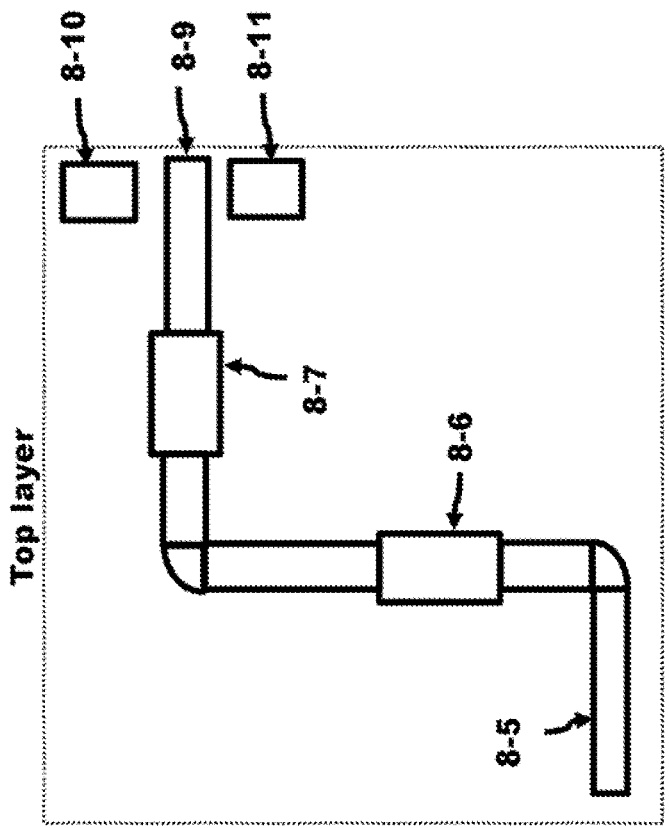
FIG. 9a illustrates the metallization layer of the top layer of the LTCC substrate in the endfire antenna of FIG. 8 in accordance with the present invention.
Figure 9C:
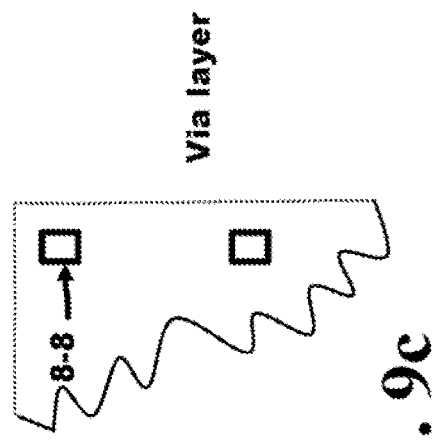
FIG. 9c presents the metallization layer of the vias in the LTCC substrate in the endfire antenna of FIG. 8 in accordance with the present invention.

FIG. 8 illustrates another pattern 8-1 of a dipole on the top and bottom layer of an LTCC substrate. The substrate is not shown in this figure. The top layer consists of the bonding pad 8-10, 8-9 and 8-11 and the traces 8-7 and 8-6 which are quarter wave matching units. The last patterns on the top layer are the interconnect 8-3 and the one half of the dipole 8-5. The bottom layer consists of the reflector 8-2 with an additional interconnect trace to the second half of the dipole 8-4. Finally, the top and bottom layers are connected at the solder bump pads by the use of vias (see 8-8). FIG. 9a illustrates the metallization pattern of the top layer including the site about locations 8-10, 8-9 and 8-11. In addition, the quarter tuning waveguides of 8-7 and 8-6 are illustrated. Finally, the first half of the dipole 8-5 is shown. FIG. 9b provides the pattern of the bottom layer showing the reflector and the second half of the dipole antenna 8-4. FIG. 9c presents the via layer patterning consisting of the vias 8-8.

Figure 10:
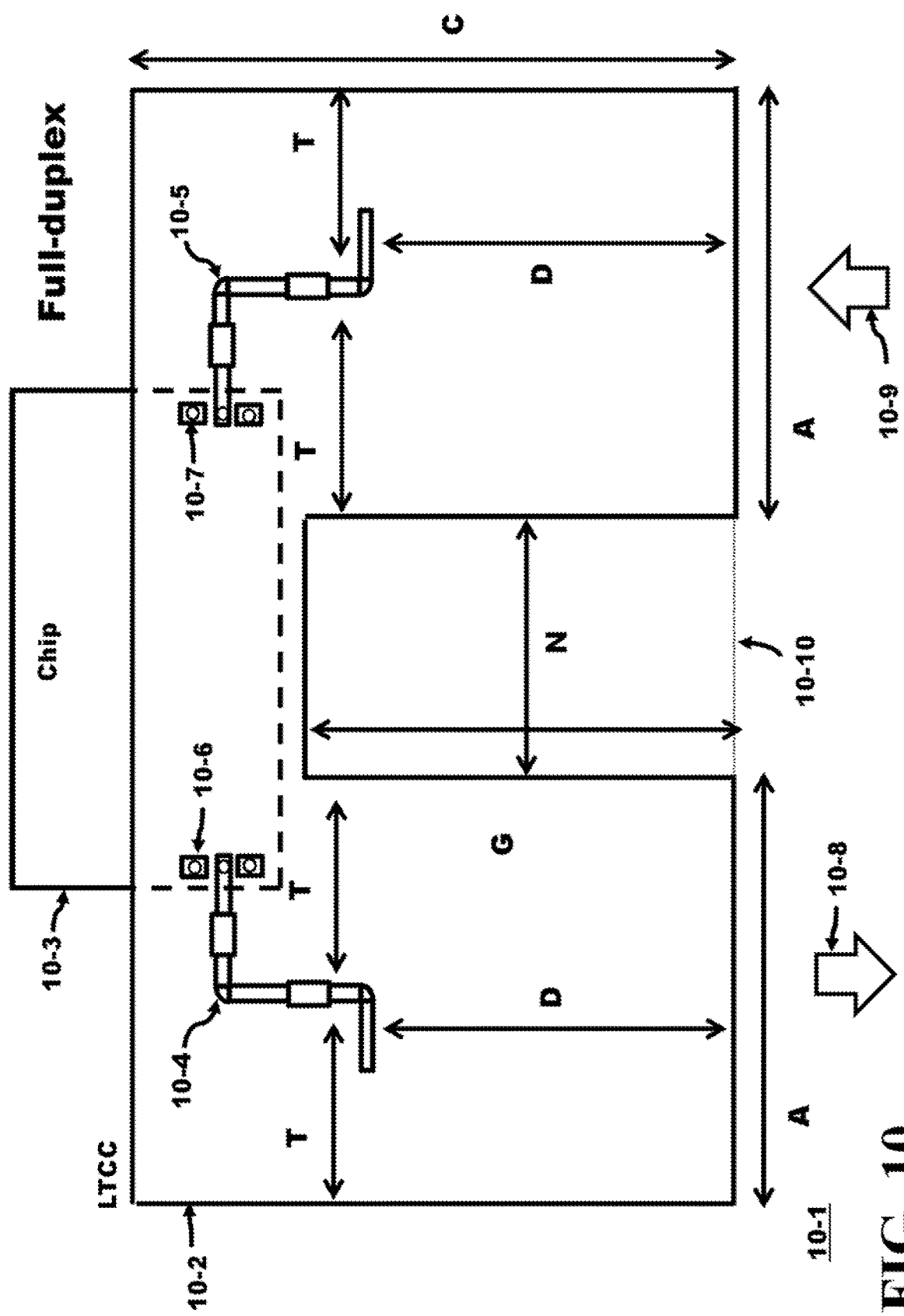
FIG. 10 illustrates a top view of the notched two antennas LTCC substrate solder bumped to a chip in accordance with the present invention.

In FIG. 10, an LTCC substrate 10-2 is coupled to a chip 10-3 forming a full duplex system 10-1. Two dipole antennas (top metallization layer is shown) 10-4 and 10-5 are fabricated on one substrate 10-2. The dipole uses the pattern shown in FIG. 8. The LTCC substrate is solder bumped to the chip using solder bumps (for example see 10-6 and 10-7). Although not illustrated, additional solder bumps are always used to firmly attach the chip to the LTCC substrate or substrates whenever the two are connected together. The endfire antenna on the left generates an output signal to free space 10-8 while the endfire antenna on the right receives an input signal from free space 10-9. Another possibility is for both endfire antennas to transmit signals to free space or for both endfire antennas to receive signals from free space. A notch with a dimension N (2 mm) by G (2 mm) is formed in the LTCC substrate between the two dipole antennas in the LTCC substrate. This notch is a typical dimension and plays an important role to isolate the effects of one antenna 10-4 from the second antenna 10-5.

Assume that the notch in FIG. 10 was removed and the substrate was extended to the dotted line 10-10. The substrate would now be rectangular with dimensions of C by (2A+N). The endfire antenna 10-5 would be located T units from the right hand edge of the LTCC substrate and at least 3T+N units from the left hand edge of the LTCC substrate. Similarly, the endfire antenna 10-4 would be located T units from the left hand edge of the LTCC substrate and at least 3T+N units from the right hand edge of the LTCC substrate. Thus, the directivity of these two dipoles would be off-center. Based on the results provided in FIG. 3c, as the off-center dimension of the dipole antenna increases, the gain drops and the main beam is directed away from an azimuth of 270°. In addition, the two dipoles will interfere with one another. The placement of the notch in the substrate isolates the antennas from each other.

The notch is formed in the LTCC substrate with a depth G of the notch that is less than D which is the distance of the dipole from the far edge. The dimension N is sized to place each dipole T units away from the near edges of the LTCC substrate. This insures that each dipole is centered within its portion of the LTCC substrate which minimizes the influence of one endfire dipole antenna on the other. Each dipole antenna is now displaced a distance T from the near edges of the substrate and displaced a distance D from the far edge of the substrate providing a gain of 10 dB for each antenna. Since this chip receives 10-9 and transmits 10-8 simultaneously, this interface is known as a full duplex link.

Figures 11A, 11B:
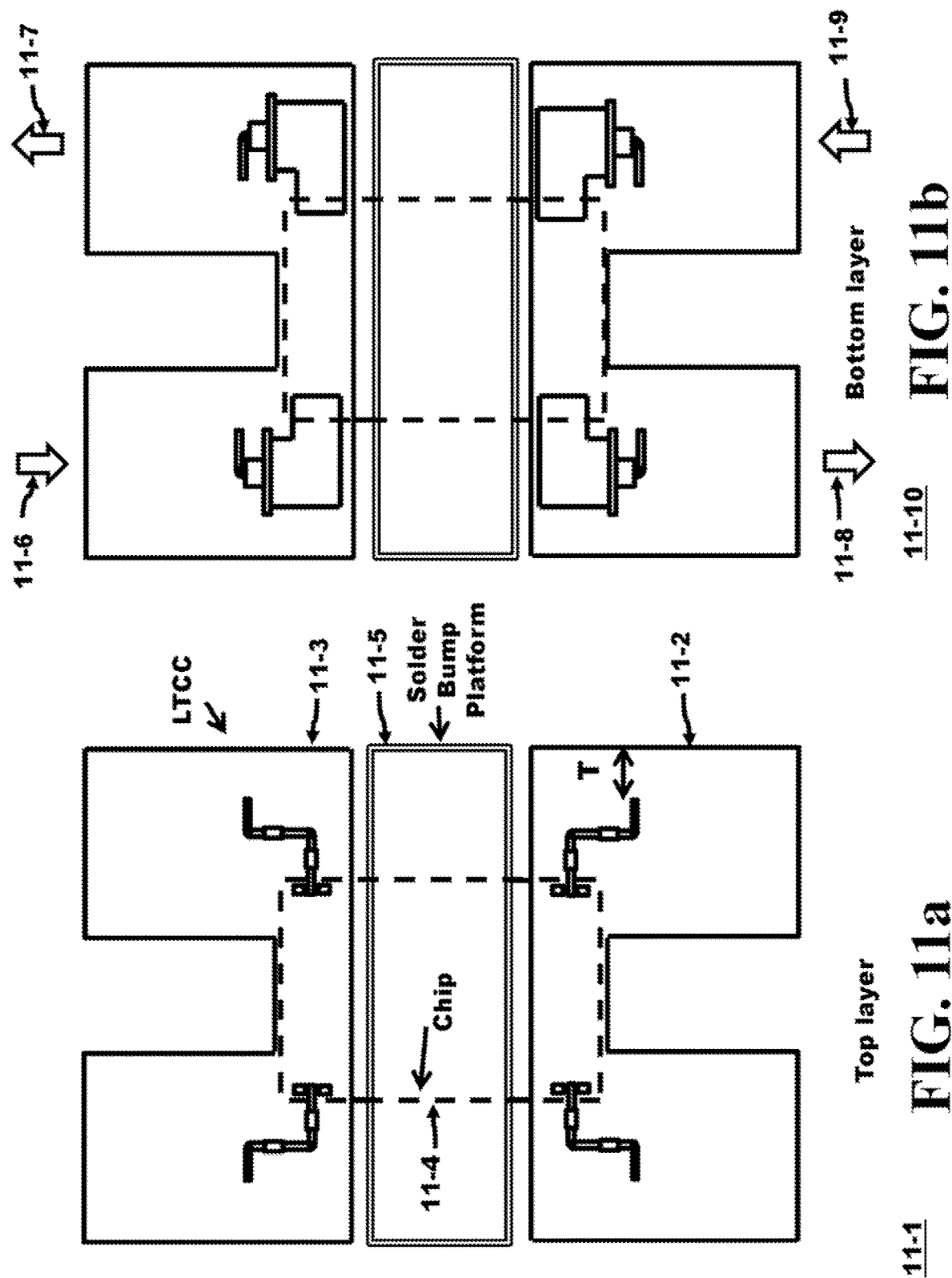
FIG. 11a-b depicts a top view of a pair of notched two antennas LTCC substrates solder bumped to a chip including a solder bumped platform in accordance with the present invention.

This idea can be extended to a system 11-1 as is illustrated in FIG. 11a which shows the top layer of two LTCC substrates 11-2 and 11-3 and a solder bump platform 11-5. The solder bumped platform 11-5 can be similar to or different from an LTCC substrate and is used to provide solder bumped connections to the chip 11-4 and a PWB (not shown). In addition, the solder bump platform can be used for additional wiring to connect to the chip and from the chip while the two LTCC substrates 11-2 and 11-3 can provide the full duplex mode in the vertical directions. Another possibility is to fabricate the solder bumped platform 11-5 and the two LTCC antennas 11-2 and 11-3 as one LTCC substrate. This would make the assembly of the system simpler since the number of separate parts has been reduced.

Note in both cases that the notches have isolated the two dipole antennas from each other. The reflector on the lower layer prevents the signal from propagating backwards into the LTCC substrate. FIG. 11b illustrates the bottom layer 11-10 of the system 11-1 illustrated in FIG. 11a. The full duplex mode is illustrated by the arrows 11-8 and 11-9 for the lower LTCC substrate and the arrows 11-6 and 11-7 for the top LTCC substrate.

FIG. 12a illustrates an LTCC substrate 12-1 with the direction of maximum power transfer 12-2 being emitted from the far edge of the substrate. Once this substrate is placed on the board and in the package and then that package is placed inside of a portable unit, the question remains in which direction does the portable unit need to point to send out the endfire antenna radiation. One possibility is for the arrow corresponding to 12-2 to be printed on the portable unit itself. Once the user picks up the portable unit and looks at the portable unit, the arrow would indicate the direction the portable unit would need to be pointed in order to help improve the communication channel in an endfire design for a 60 GHz link. Assuming that the portable unit 12-3 is sending its information in the direction of 12-4 as illustrated in FIG. 12a, the marking can be on the portable unit or it can be displayed on the display screen 12-5 of the portable unit. For example, the orientation arrow 12-7 is indicated on the display screen 12-5. Although it shown as a phone, this phone is only a representation indicating that the unit is a portable unit which can include a smart phone, handheld PC, tablet, game controller, iPad, etc., utilizing any mobile operating system, e.g., Android, iOS etc. The portable unit may need to be pointed up or down to receive an improved reception by responding to the up/down icon 12-8. Finally, the display can have a signal bar 12-6 which illustrates the strength of the outgoing and incoming endfire signal.

In the FIG. 12b, two portable units are presented. Both users are actively using their portable units and they desire to communicate to one another using the endfire antenna. The user holding portable unit 12-9 points his portable unit towards the portable unit 12-11, meanwhile, the second user points the portable unit 12-11 towards the first portable unit 12-9. A communication channel at 60 GHz will be established. Once both users are satisfied with the communication channel they can transfer data, movies, pictures or any other information. Another possibility is for the user holding the portable unit 12-11 to respond to voice or sound commands 12-10 emitted from the portable unit 12-11. The portable unit may indicate to turn the portable unit to the right or move the portable unit down or point the portable unit up. In FIG. 12c is a representation of the two portable units but only indicating what the display screen 12-12 and 12-13 may look like. In the screen 12-12, the arrow aligned with the LTCC substrate is pointed towards the portable unit with the screen 12-13. A visual direction 12-14 shows a direction to turn the portable unit to receive a signal of maximum strength. As the user proceeds to move the portable unit in this direction, the link between the portable units improves. At some point, the link at 60 GHz is sufficient to transfer the massive amount of data between the two endpoints of the portable units.

Figure 13:
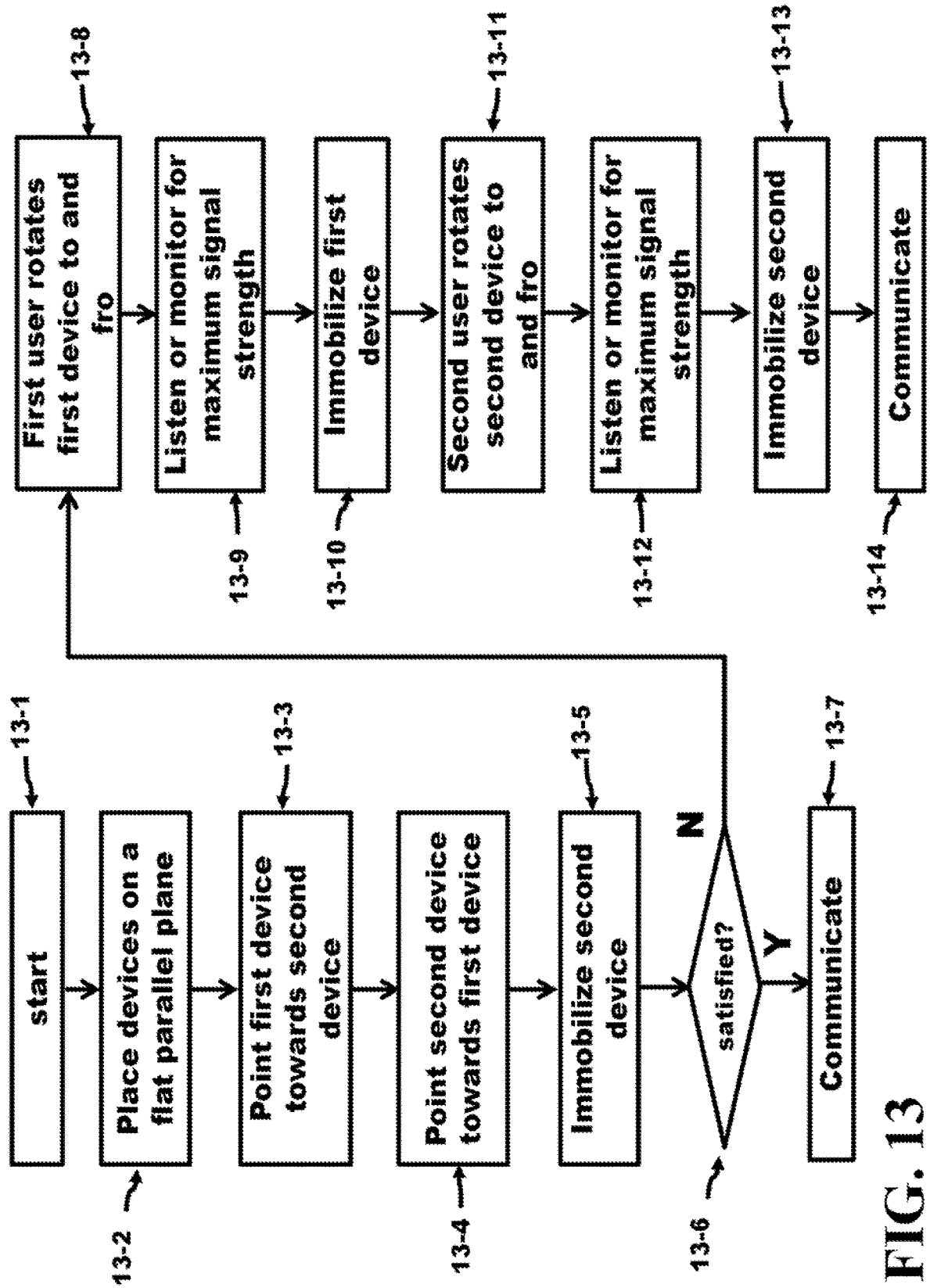
FIG. 13 illustrates a flow chart of adjusting two portable units with endfire antennas for maximum signal in accordance with the present invention.

FIG. 13 illustrates a flowchart corresponding to the apparatus shown in FIG. 12b of forming an endfire connection and communicating between two portable units. Both users of the portable units start 13-1 by the users placing their devices on the flat parallel plane 13-2 which provides stability by minimizing vibrations. The first user points his device towards the second user 13-3 and the step of the second device being pointed towards the first device is performed by the second user 13-4. The second device is immobilized 13-5. In the decision block 13-6 if the users are satisfied they can communicate 13-7 and send data between the portable units. However, if the users are not satisfied 13-6, the first user would rotate his device to and fro 13-8 and as the user performs this function, the first user would listen for audio commands or monitor his display screen to determine the maximum signal strength indication 13-9. Once the first user is satisfied with the maximum signal being achieved, the first device would be immobilized 13-10. Then, the second user would rotate their device to and fro 13-11. The second user would listen for audio commands or monitor his display screen to find where the maximum strength is provided 13-12. Once the second user is satisfied the second device is immobilized 13-13 and both users will communicate 13-14 between the two portable units using the endfire technique and transfers data using one of the carrier frequencies at 60 GHz.

In the FIG. 14a, the two portable units 14-1 and 14-2 use a four quadrant endfire direction antenna similar to what was shown in FIG. 7. The four quadrant endfire antennas 14-3 and 14-4 can switch between listening and transmitting on its various endfire antennas. Either phones or portable units 14-1 and 14-2 can operate in a half-duplex mode. A switch internal to each transceiver would enable the receiver to the antenna and disable the transmitter from the antenna or vice versa. A full duplex mode is also possible; however, the antenna structure of each endfire antenna must be modified to include a receive and transmit antenna in each of the four directions. Once a connection is made, if both users are satisfied with the connection then the other three endfire antennas can be disabled along with their respective transceivers to save power. However if the users are not satisfied then a process can be used to improve the signal integrity of the communication channel between the two portable units. In the FIG. 14b, the display screens 14-5 and 14-6 for the two portable units present a quadrature icon on the screen aligned with the four endfire directions from the 60 GHz antennas.

FIG. 15a illustrates two portable units 15-2 and 15-3 which may be embedded inside of moving units such as helmets, cars, remote-controlled vehicles, robots and assembly-line machines. These devices can be firmly coupled to the frame of the vehicles or placed on a rotatable platform within the structure to achieve greater directional control. Although it is shown as a phone, this phone is only a representation indicating that the unit is a portable unit. And the portable electronics within the unit can be embedded in any type of machine, structure or vehicle. For example, on the roadway, a car can be represented by 15-2 which is emitting an endfire signal from the front of a first vehicle and a second vehicle in front of the first vehicle is represented by 15-3 and has an endfire transceiver located in the rear of the vehicle. As the first vehicle follows the second vehicle down the road, a communication channel is maintained. The communication channel is maintained by a computer system containing memory, software, and interface components. The computer has a data path and control path to control the flow of data in the computer to determine data manipulations. For example, data manipulations can be performed on communication channels to improve the quality of the channel. Then, if the second vehicle turns around a corner and maintains within a turn radius of 120° or so, a rotatable platform may not be required since each portable unit has an angular spread to cover this turn radius. If this spread is insufficient, the endfire antennas can be mounted on a rotatable platform within the moving vehicles to capture a larger angular spread. The +/−60° spread indicated by 15-1 represents the angular spread corresponding to the system illustrated in FIG. 2d. Mounting this device within the cars provides a +/−60° range where the signal output drops to 0 dB. The sensitivity of the receiver needs to account for the link loss within the channel since the power that the receiver captures with the endfire antenna in portable unit 15-3 is less than the power emitted by the transmitter in portable unit 15-2. To compensate for the link loss, the sensitivity of the receiver in 15-3 can be improved or can be designed to match the specification for this type of interface. As the second vehicle 15-3 moves down the road, the first vehicle 15-2 which is behind the second vehicle corresponding to 15-3 can make a 60 GHz link and communicate with the moving device ahead of it. This communication can consist of massive amounts of data flow between the two moving vehicles, collisions detection, transfer of data, or any type of video or other data streams that may be of interest for use between the two users in the moving vehicles. FIG. 15b illustrates display screens 15-4 and 15-5 which may be located within the moving vehicle or on the dashboard presenting to the user the direction that their endfire antenna is pointing or the direction that their endfire receiver is receiving a signal.

Figure 16:
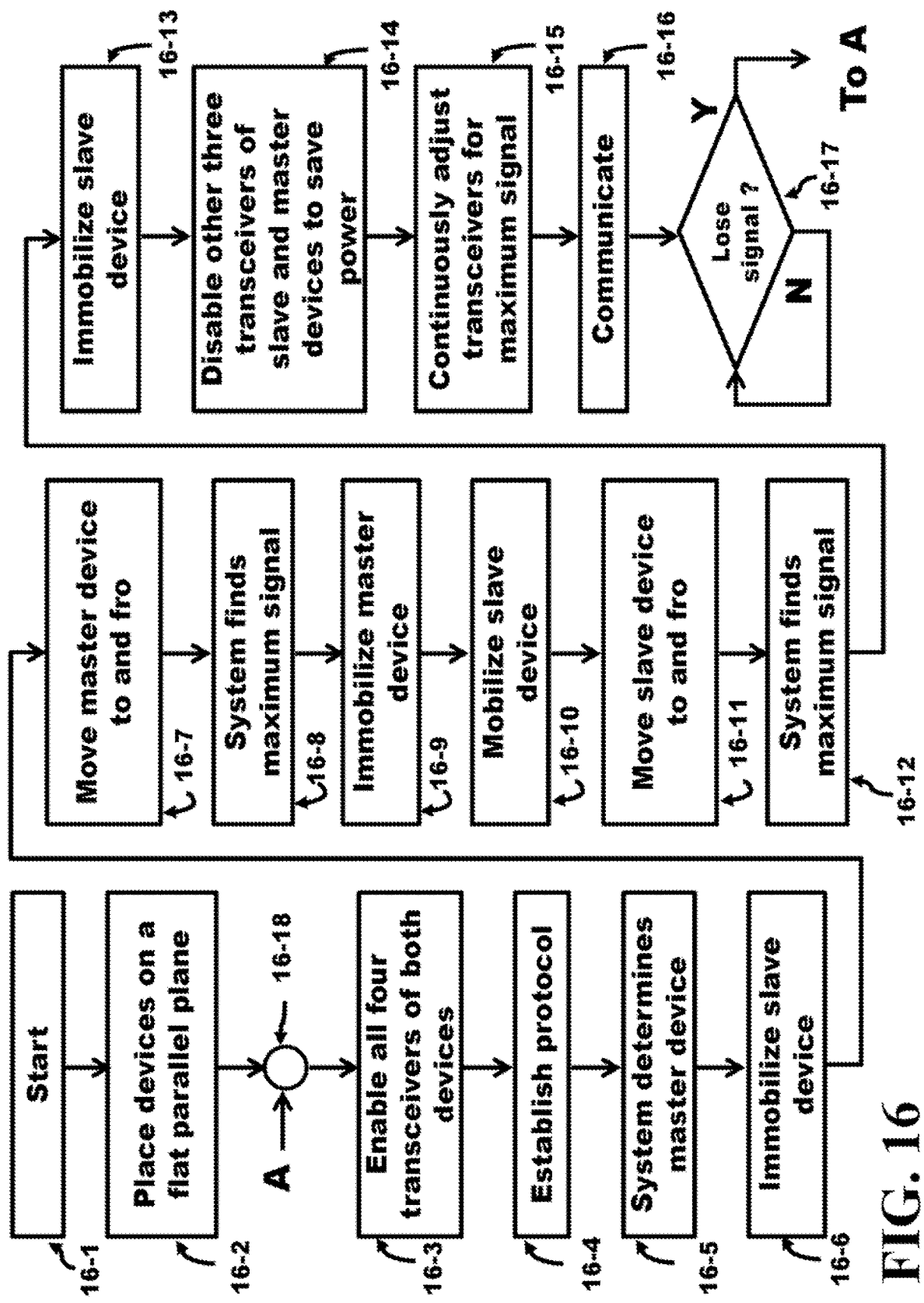
FIG. 16 shows a flow chart for FIG. 14a and FIG. 14b of adjusting two portable units each in a moving object and using a quadrature endfire transceiver in accordance with the present invention.

FIG. 16 presents the flow chart for the apparatus corresponding to FIG. 14. The users of the portable units desire to contact each other and start 16-1. Both users place their devices on the flat parallel plane 16-2. After passing through the bubble 16-18, all for transceivers in both portable units would be enabled 16-3. In 16-4, an adequate communication channel is established to form a protocol 16-4 and the system would determine which one of the two portable units would be the master device 16-5. The master device would immobilize the slave device by issuing instructions to the slave device to instruct the user not to move the device 16-6. The master device would request that the user moved the device to and fro 16-7. The system would determine the maximum signal 16-8 and instruct the user to immobilize the master device 16-9. The system would then instruct the slave device to become mobile 16-10 by indicating to the user to move the slave device to and fro 16-11. The system would then measure the maximum signal 16-12 and immobilize the slave device 16-13. Once the communication channel achieves maximum signal strength, the remaining three endfire antennas and transceivers of both the slave and master devices would be disabled to save power 16-14. As the two users communicate, the master will make decisions to determine if any movements of the portable units are required to seek maximum signal strength 16-15. At this point, the users would be communicating 16-16 and sending data using the endfire antenna at 60 GHz. The decision block 16-17 determines if the signal was lost. If not, monitoring of the communication channel is maintained. When the signal is lost, the step moves to A which corresponds to the bubble 16-18 and the search maximum signal process is repeated.

Figure 17:
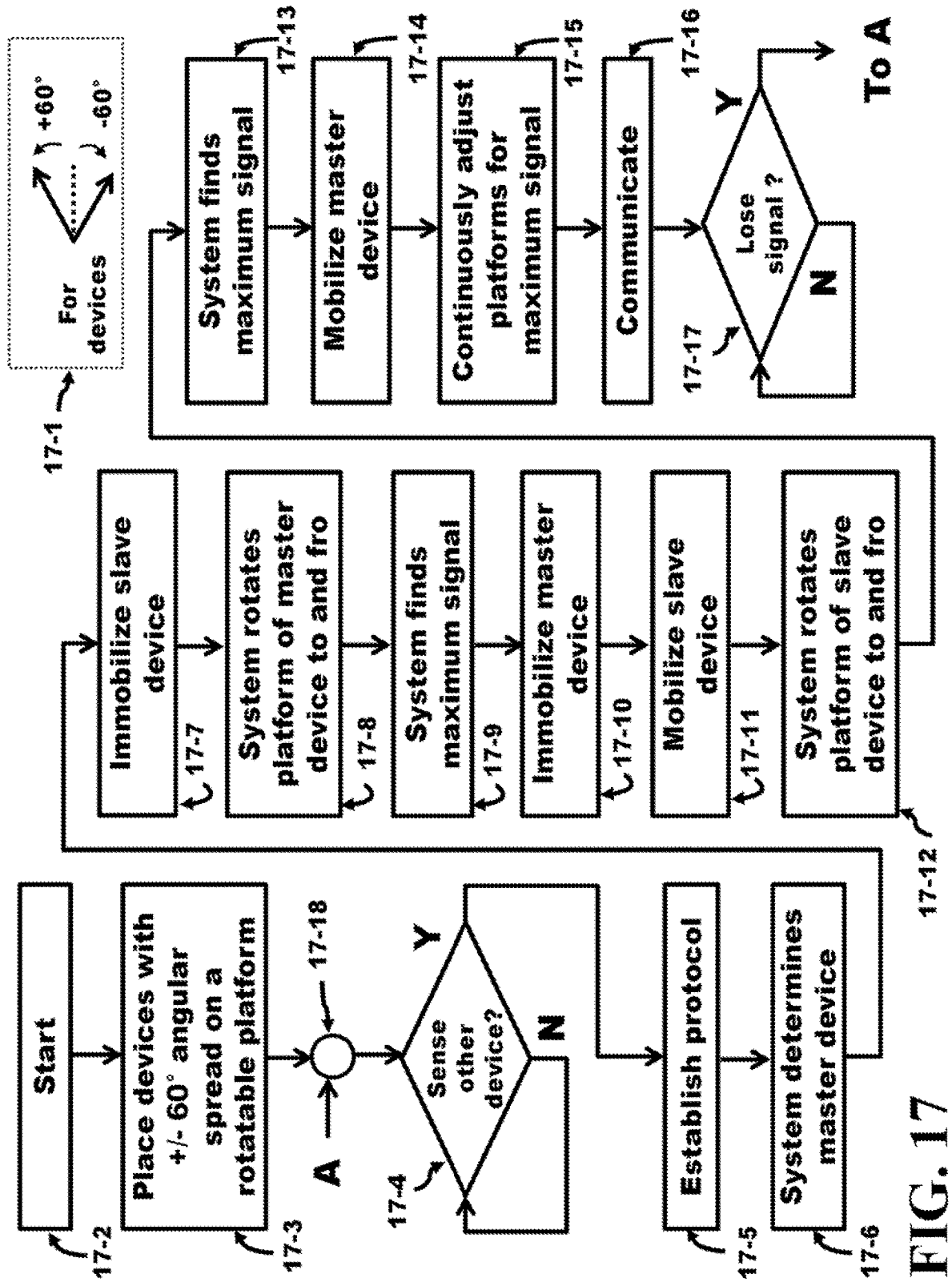
FIG. 17 presents a flow chart for FIG. 15a and FIG. 15b of adjusting two portable units each in a moving object and using a quadrature endfire transceiver on rotatable platforms with unknown +/−60° orientation for maximum signal in accordance with the present invention.

FIG. 17 presents the process flow for the apparatus corresponding to FIG. 15 which determines how to achieve maximum signal strength or at least maintain proper communications between two moving vehicles with a rotatable platform. It is assumed that the +/−60° angular spread of coverage is insufficient requiring the need for a rotatable platform. The angular spread is illustrated in 17-1 where the device transmits 0 dB at +/−60°. After starting 17-2, the devices which have up to a +/−60° angular spread are placed on a rotatable platform 17-3 in each of the moving units. After passing through the bubbles 17-18, the devices attempt to sense the other device as indicated in decision block 17-4. If they do not detect the other device, the system continues sensing. Once detection is achieved, a protocol is established 17-5. The system then determines if the first device or second device is the master device 17-6 and immobilizes the slave device 17-7. The master device rotates the platform of the master 17-8 until it achieves maximum signal strength 17-9. Then the master is immobilized 17-10, the system mobilizes the slave device 17-11 and instructs the slave device to search for the maximum signal 17-13 by moving to and fro 17-12. Once this has been determined, the system mobilizes the master device 17-14 and maintains a continuous adjustment to the platforms for maximum signal transfer 17-15 whereupon communication 17-16 between the two moving devices can occur. The set up time to perform this function depends largely on the amount of time for the rotatable platform to perform a corrective movement. The faster the platform can rotate, the quicker the system can achieve a maximum signal strength link. The system continuously monitors to see if the signal was lost; however, once the signal is lost then moved to A which brings the system back to the bubbles 17-18 to repeat the process of establishing a communication channel.

FIG. 18 illustrates two portable units 18-1 and 18-2 where the endfire radiation is pointing in different directions such that the portable units cannot communicate with one another. A process flow can be developed for the portable units 18-1 and 18-2 to follow such that a communication channel can be established. FIG. 18b illustrates the display screen 18-3 and 18-4 corresponding to the devices 18-1 and 18-2, respectively illustrating the direction of the endfire antenna communication paths.

FIG. 19 illustrates two portable units 19-1 and 19-3 each having an endfire antenna in all of the four quadrants 19-2 and 19-4. Because the endfire antennas are based in each the four quadrants, communications will typically occur independent of which direction the portable units are pointing when placed on a plane. This allows a protocol to be established, and through a process, one can improve the signal integrity of the link and furthermore disable the other three transceivers and the endfire antennas associated with them to reduce power dissipation. A process flow will be illustrated shortly.

Figure 20:
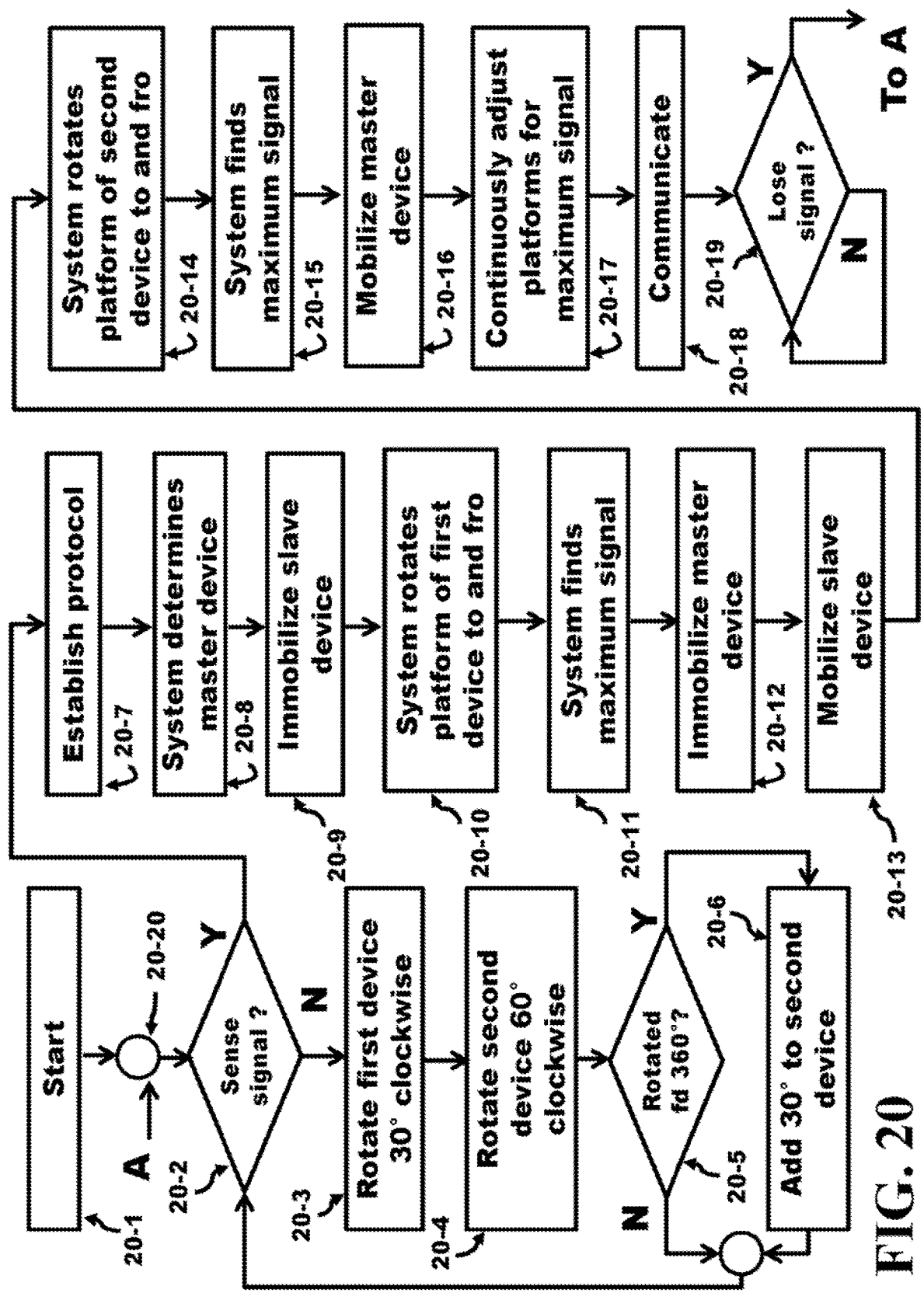
FIG. 20 presents a flow chart for FIG. 18a and FIG. 18b of adjusting two portable units each using a single endfire transceiver in accordance with the present invention.

FIG. 20 is the process flow corresponding to the apparatus illustrated in FIG. 18a. In FIG. 18a, two portable units need to communicate with one another and currently are out of range of communication since their endfire antennas are pointing in the inappropriate direction. The users of the first and second device initiate the process 20-1. After passing through 20-20, the system determines whether a signal is sensed 20-2. If there is no signal detected, the first device is rotated 30° clockwise 20-3. The second device is rotated 60° clockwise 20-4. The decision block 20-5 requests whether there's been a complete rotation of the first device by 360°. If not, the step moves back to decision block 20-2 to see if the signal was sensed. If not, the rotation of the first device 30° clockwise 20-3 and the rotation of the second device 60° clockwise is continued until a signal is sensed or the first device has rotated more than 360° 20-5. If the rotation is more than 360° then add 30° to the second device 20-6 and move to decision block 20-2 to see the signal is sensed. If not, continue doing the process 20-3, 20-4 and 20-5 until a signal is sensed. Going through these steps, the orientation of the two endfire antennas will eventually become partially aligned allowing the devices to sense one another. Once the signal is sensed 20-2 then a protocol is established between the two portable units 20-7. The system at this point would determine the master device 20-8 and cause the second device or slave device to be immobilized 20-9. The system would then rotate the platform to and fro 20-10 until the maximum signal is found 20-11 thereby immobilizing the master device 20-12. Now the slave device is mobilized 20-13 and the system rotates the platform to and fro for the slave device until the maximum signal occurs 20-15 whereupon the master device is mobilized 20-16. At this point the platforms are continuously adjusted for maximum signal and a communication channel 20-18 would pass data to one another. The system monitors for the loss of signal continuously and if there is a loss the system moves to the bubble 20-20 to restart the process.

Figure 21:
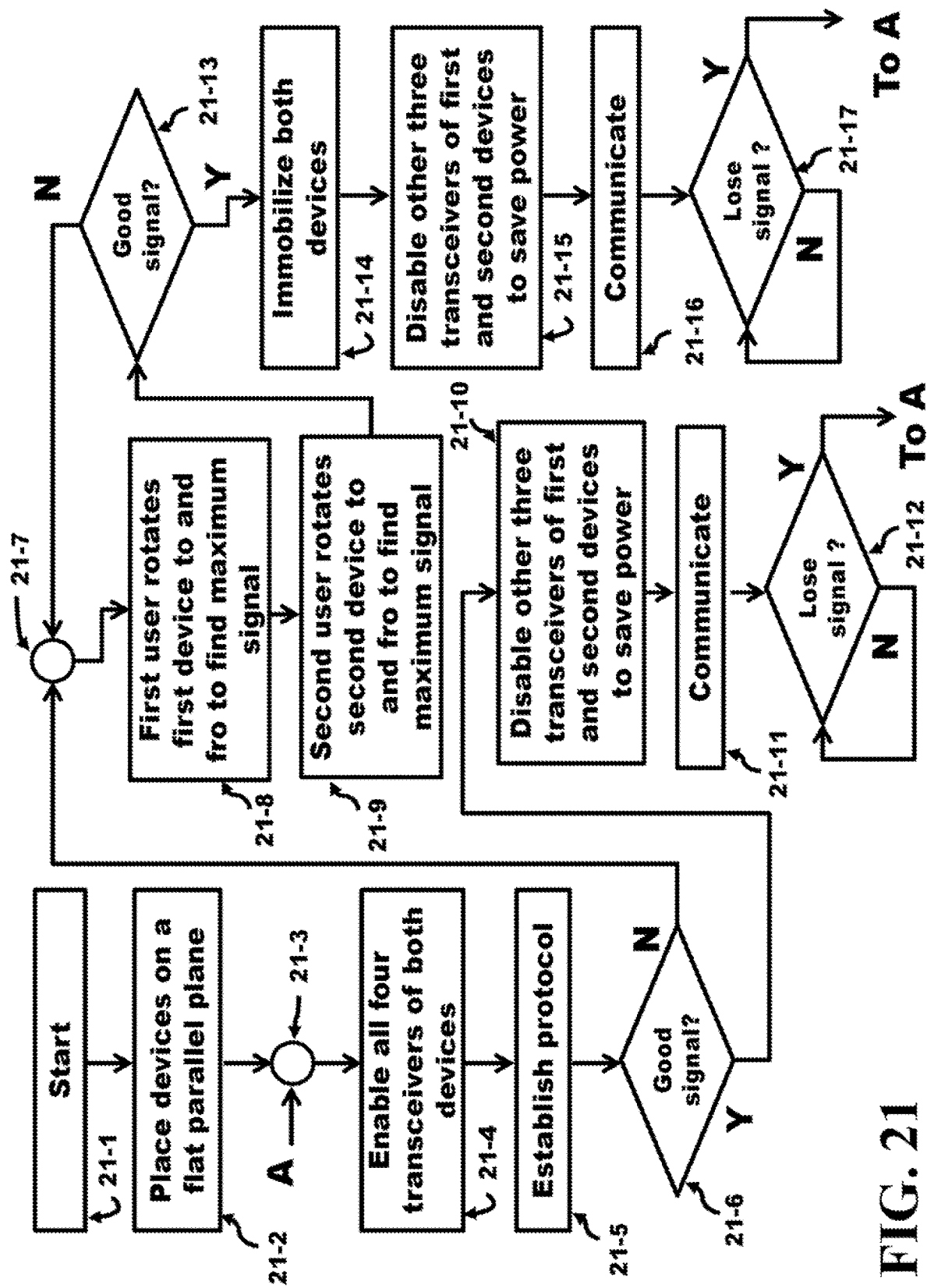
FIG. 21 illustrates a flow chart for FIG. 19 of adjusting two portable units each using a four quadrant endfire transceiver in accordance with the present invention.

FIG. 21 provides the process flow for the apparatus structure illustrated in FIG. 19. Once the users determine they want to make a communication channel, the process starts 21-1. The users place their devices on the flat parallel plane 21-2. After the bubble 21-3 all of the four transceivers of both devices are enabled 21-4 thereby allowing a link to form and a protocol to be established 21-5. If the signal is good and satisfactory as determined in the decision block 21-6 then the other three transceivers and endfire antennas 21-6 would become disabled to save power 21-10 allowing communication to occur 21-11. The system continuously monitors for loss of signal and if it occurs moves to the bubble 21-3 to start the search process again. If the decision block 21-6 indicates that the signal needs further improvement move to bubble 21-7 and allow the first user to rotate their device to try to achieve a maximum signal 21-8, then allow the second user to rotate their device to find the maximum signal 21-9. At this point, the signal should be of good quality as indicated in the decision block 21-13; however, if not, return to the bubble 21-7 and continue the to and fro process. If the signal is good at decision block 21-13 then immobilize both devices 21-14 and disable the other three transceivers and endfire antennas on both devices to save power 21-15. Allow communication to occur 21-16 such that video data or large amount of information can be transferred between the two portable units. The system monitors if the signal was lost and if the signal does become lost in decision block 21-17 move to the bubble 21-3. At this point the process would be repeated until a communication channel has been established.

Figure 22:
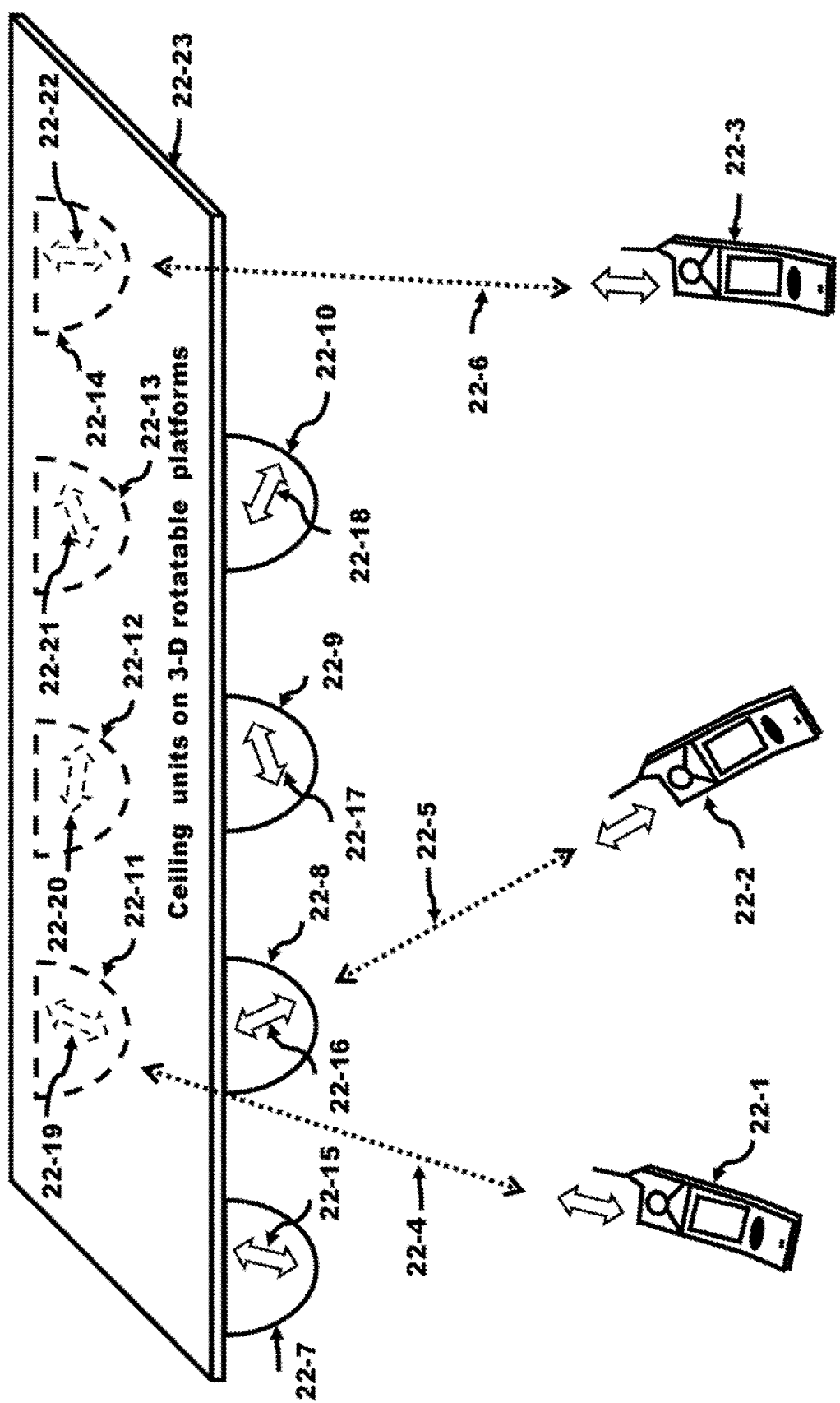
FIG. 22 depicts portable units with an endfire antenna communicating to a network formed from an array of rotatable antenna platforms mounted in ceiling units in accordance with the present invention.

FIG. 22 indicates a number of portable units in a large room such as an airport, auditorium, shopping mall, residential room or large convention center. The portable units 21-1, 21-2 and 21-3 have an endfire device and the users point their portable units towards the ceiling 22-23. Embedded within the ceiling is an array 22-7 through 22-14 of endfire antennas on a three-dimensional rotational platform 22-15 through 22-22. The array contains a plurality of components to provide adequate communication. The system controls any unused endfire antennas in the array which are redirected to point within the large room to provide for the maximum coverage of unused space. Thus, when a new user enters the room and fills up some of the unused space, once the user points their portable unit towards the ceiling, coverage is practically guaranteed. In addition, this initialization allows the system to follow users even if the users shift their portable unit and point their portable unit in another direction while they're using it. The system will compensate by potentially introducing new endfire transceivers to pick up the signal from these shifted portable units. An additional benefit for this technique is that the plane of the far edge becomes more perpendicular to the portable unit. This improves the quality of the received signal since a greater portion of the received signal will be captured by far end. Thus, the constraints of the specification on the receiver can be reduced providing a power savings at the receiver end.

The ceiling 23-23 in FIG. 22 has an array of 3-D rotatable platforms and thereby gives great flexibility to intercepting the signal from the handheld portable units. For example, user holding 21-2 establishes a communication channel 22-4 with one unit 21-11 in the array. The 3-D rotatable antenna 22-19 adjusts and maximizes the signal transfer between the portable user and the ceiling unit 22-11. Similarly, the portable unit 22-2 desires to establish a communication channel and their endfire antenna happens to be pointing at one unit 22-8 of the array. Within the unit is a 3-D rotatable platform endfire antenna 22-16. This antenna is adjusted to maximize the signal to the established channel 22-5. User 22-3 establishes a communication channel 22-6 to the 3-D rotatable platform 22-22 located within a unit 22-14 of the array where the process of maximizing the signal had occurred. Thus, the array embedded within the ceiling unit (or even the walls or other surfaces) will allow the user to have greater flexibility to establish a low power communication channel with an endfire antenna operating at 60 GHz. This flexibility allows the user to be less concerned in pointing and adjusting the portable unit since the brunt of the work is taken over by the system which controls the array of 3-D rotatable platforms within the array. Once the communication channel has been established a very low-power transfer can occur between the portable unit and the endfire antenna on the 3-D platform with massive amounts of data at 60 GHz. This will allow for a very efficient means of transferring data within a large room or an auditorium.

Figure 23:
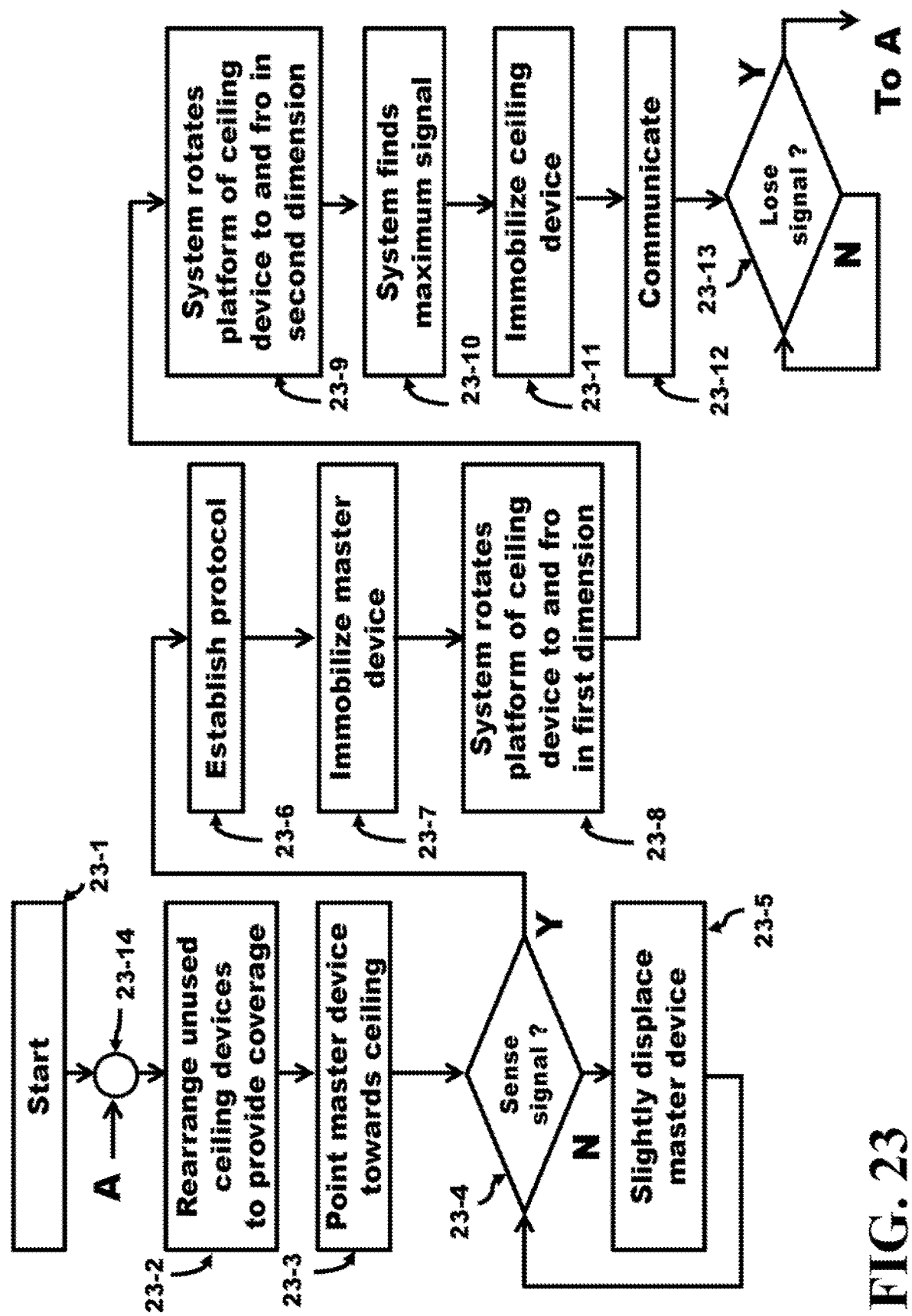
FIG. 23 presents a flow chart for FIG. 22 of adjusting the array of rotatable antenna platforms mounted in ceiling units to the portable units in accordance with the present invention.

FIG. 23 is the process flow that corresponds to the apparatus illustrated in FIG. 22. The process flow in FIG. 23 assumes that only the ceiling (not walls) have an array of units which consists of rotatable platforms that are 3-D-based. However, the situation becomes easier if the walls also contain the array. Once the user enters the auditorium and desires to communicate then the process starts 23-1 and passes through the bubble 23-14. The system rearranges all endfire antennas of unused ceiling 3-D rotatable platforms to provide maximum coverage 23-2. The user points their master device towards the ceiling 23-3. If the signal is not sensed 23-4, slightly displace the master device 23-5. Once one of the various platforms in the array that are in the ceiling sense the signal 23-4, the 3-D platform establishes a protocol 23-6 and the master is immobilized 23-7. The system rotates the platform in a first dimension to maximize the signal 23-8 and continues to rotate that platform in the ceiling in a second dimension 23-9 until a maximum signal occurs 23-10. Whereupon the 3-D platform in the ceiling is immobilized 23-11 and the communication can be established 23-12. If the signal becomes lost during the communication 23-13, the step moves to bubble 23-14 and restarts the search process.

Figure 24:
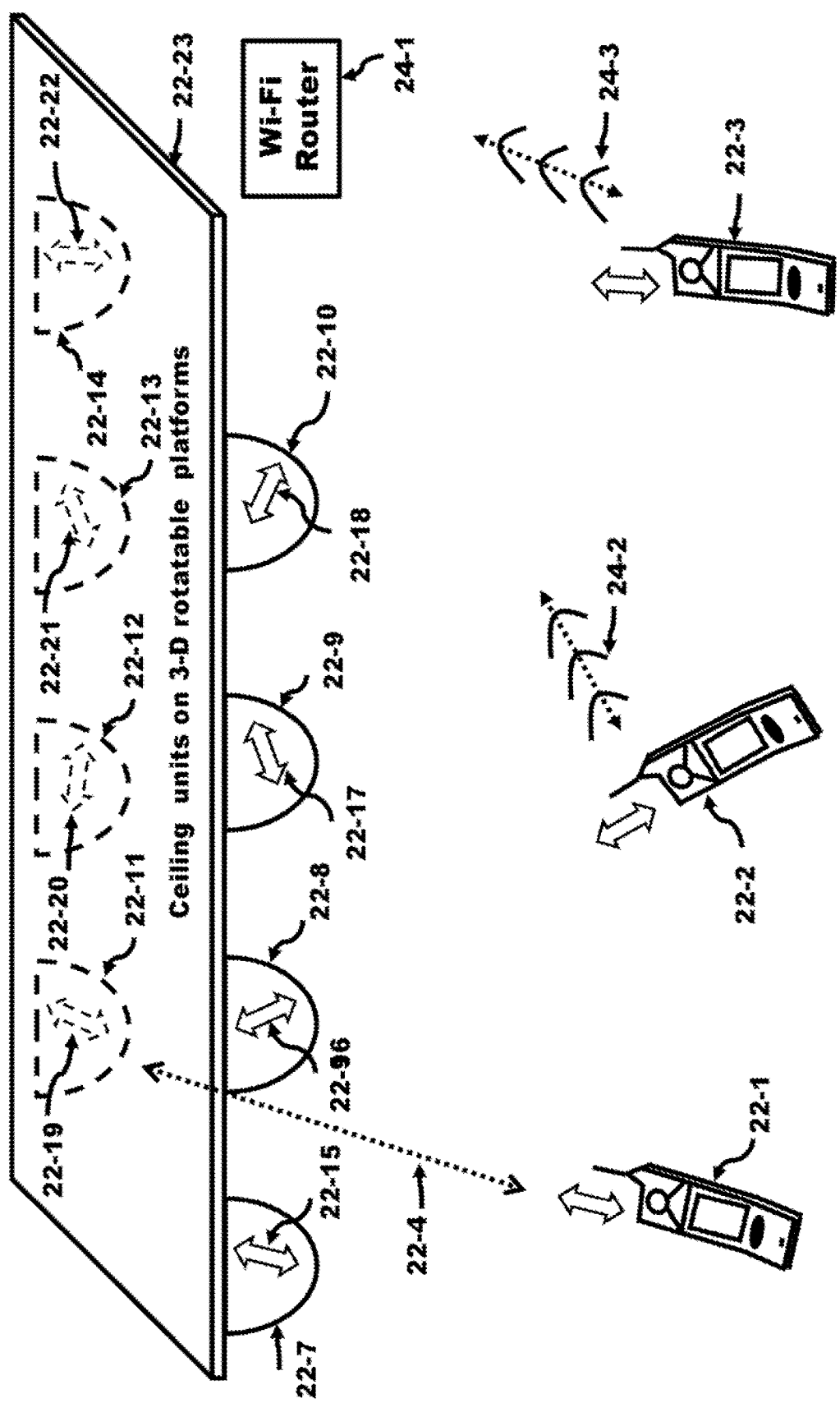
FIG. 24 shows portable units with an endfire antenna communicating to a network formed from an array of rotatable antenna platforms mounted in ceiling units or communicating with a conventional Wi-Fi router in accordance with the present invention.

FIG. 24 illustrates a potential power management system that can be used in a large auditorium or large room. When the portable units enter this large room they can hook up with the Wi-Fi interface. For example, the portable units 22-2 and 22-3 communicate with the Wi-Fi router 24-1 using the communication channel 24-2 and 24-3 respectively. Meanwhile portable unit 22-1 is communicating with the ceiling 3-D rotatable platform achieving very high data rates with substantially less power usage. After users 22-2 and 22-3 enter the room, they can make a decision to hook into the ceiling units using their endfire antenna to communicate to the 3-D rotatable platforms within the ceiling unit to achieve a communication channel with significantly less power. The process flow for the portable units 22-2 and 22-3 would utilize a similar process flow as indicated in FIG. 23.

Another possibility of what can be embedded into the ceiling units are three endfire antennas coupled together offset by an angle. The goal is for the endfire antenna to detect the user in the large auditorium without the need for a rotatable platform. FIG. 25*a* through FIG. 25*c* helps describe this better. FIG. 25*a* corresponds to FIG. 2*e* where a top view of the LTCC substrate 25-1 is illustrated where maximum power is 10 dB perpendicular out of the far end and drops down to 0 dB+/−30° in the azimuth rotational angle 25-2 and 25-3. The arrow 25-4 points to a simplified diagram. In this case, the rectangle of width A is emitting an angular spread of 60° 25-5 which corresponds to FIG. 2*e* as well. FIG. 25*b* couples three of the units of FIG. 25*a* together. In the process of combining these three units, each unit is rotated 60° from the previous one until an entire spread of 180° is achieved. For example, the endfire antenna in unit 1 25-6 has a spread of 60° between the lines 25-9 and 25-10. The endfire antenna in unit 2 25-7 has an angular spread of 60° between the lines 25-10 and 25-11. The last endfire antenna in unit 3 25-8 has an angular spread of 60° between the lines 25-11 and 25-12. The total angular spread at 0 dB between the three units which are coupled together is a 180° between the lines 25-9 and 25-12.

In FIG. 25*c*, an approximate side view of the three units in FIG. 25*b* is illustrated. The LTCC substrates 25-6, 25-8 and 25-7 each have a spread of 120° 25-16. Thus, a single unit in the wall can cover 120° in one direction and 180° in the perpendicular direction. By placing these units in the ceiling judiciously the 120° units can be overlapped to get full coverage. These units are placed in the array in the ceiling, and when the user enters a large auditorium or a large room, they will automatically be able to connect and communicate with the array in the ceiling simply by pointing their portable unit upwards. The ceiling would not require any motion units. In addition, if one of the three LTCC substrates is being currently used in a unit, there are still two other LTCC substrates that are available for other users to use. Thus, this scheme offers a great flexibility by increasing the channel throughput for users within the large auditorium.

Figure 26:
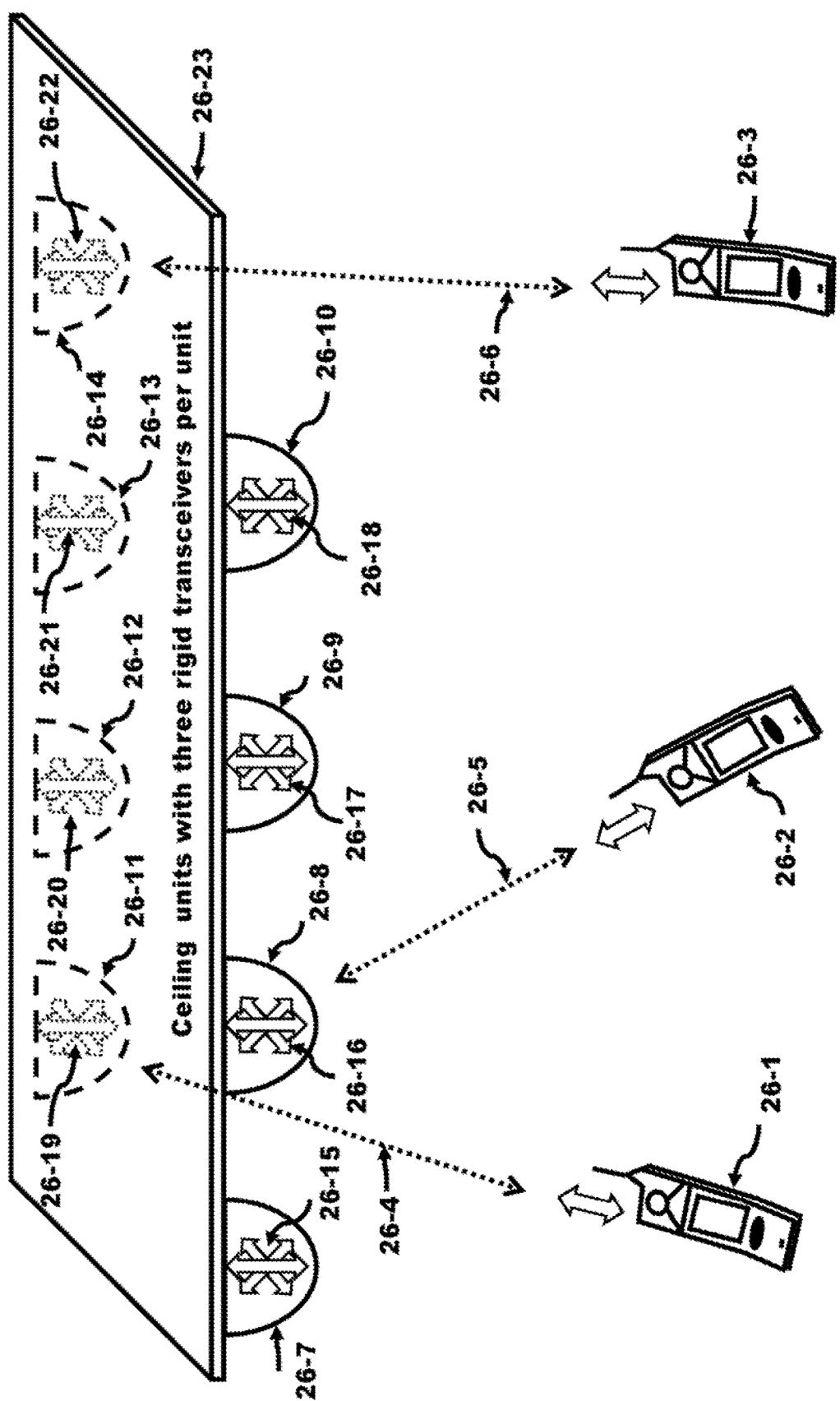
FIG. 26 presents portable units with an endfire antenna communicating to a network formed from an array of three endfire transceivers offset by 60° mounted in ceiling units in accordance with the present invention.

In FIG. 26, the symbol for these three units coupled together is illustrated by the three superimposed double-arrowed lines. When users carrying their portable units 26-1, 26-2 and 26-3 enter the large auditorium and point towards the ceiling 26-23, the transceiver which is best suited for that portable unit is activated. Embedded within the ceiling is an array of cells 26-7 through 26-14 of three rigid endfire antennas 26-15 through 26-22. For example, portable unit 26-1 establishes a communication channel 26-4 with the rigid unit 26-19 within the array cell 26-11. Similarly, the portable unit 26-2 establishes a communication channel 26-5 with the rigid unit 26-11 within the array cell 26-10. The last user, 26-3 establishes the communication 26-6 with the rigid unit 26-22 within the array cell 26-14. Although three single endfire antennas were combined together to establish a half-duplex channel, the full-duplex version can be used such that the three can be combined allowing a full-duplex communication channel to occur between the user and the ceiling units.

A summary of some of the inventive structures for a 60 GHz endfire antenna are provided.

An antenna comprising a dielectric substrate with a dielectric constant is greater than or equal to 5 is used, a first trace is fabricated on a top surface of the dielectric substrate, a second trace is fabricated on a bottom surface of the dielectric layer, a signal is used to resonate the dielectric substrate, and solder pads are connected to either the first or the second traces to couple the signal to or from the dielectric substrate. A section of the first trace is patterned into one portion of a dipole and a section of the second trace is patterned into a remaining portion of the dipole. Another section of the second trace is patterned into a reflector. This forms the basic endfire antenna. The signal is coupled into free space as an electromagnetic energy from a far edge of the dielectric substrate of the endfire antenna. As an alternative, the signal is coupled from free space into the dielectric substrate by an electromagnetic energy incident on a far edge of the dielectric substrate of the endfire antenna. The first and second traces are greater than or equal to a millimeter from both near edges and a far edge to provide a high gain. An integrated circuit chip is coupled to solder bumps and the solder bumps are connected to the solder pads to receive and transmit signals from and to the endfire antenna, respectively.

An apparatus comprising a first and a second trace fabricated on a top surface of a dielectric substrate is used, a first and a second trace is fabricated on a bottom surface of the dielectric substrate, a first signal is coupled to the first top and bottom traces resonating a first portion of the dielectric substrate, a second signal is coupled to the second top and bottom traces resonating a second portion of the dielectric substrate and at least one notch in the dielectric substrate isolates the first portion of the dielectric substrate from the second portion of the dielectric substrate. The dielectric substrate with a dielectric constant greater than or equal to 5 is used. The first portion of the dielectric substrate resonates substantially independently from the second portion of the dielectric substrate. A section of the first top trace is patterned into one portion of a first dipole, a section of the first bottom trace is patterned into a remaining portion of the first dipole and another section of the first bottom trace is patterned into a first reflector which forms a first endfire antenna. A section of the second top trace is patterned into one portion of a second dipole, a section of the second bottom trace is patterned into a remaining portion of the second dipole and another section of the second bottom trace is patterned into a second reflector which forms a second endfire antenna. The first signal is coupled from free space as a first electromagnetic energy incident on a far edge of the first portion of dielectric substrate or the first signal is coupled into the free space as a second electromagnetic energy from the far edge of the first portion of dielectric substrate. As an alternative, the second signal is coupled from free space as a second electromagnetic energy incident on a far edge of the second portion of dielectric substrate or the second signal is coupled into the free space as a first electromagnetic energy from the far edge of the second portion of dielectric substrate. The first top and bottom traces are greater than or equal to a millimeter from both near edges and a far edge of the first portion of the dielectric substrate to generate a large gain.

A method of forming an endfire antenna by patterning a first portion of a first trace on a first surface of a dielectric substrate and a first portion of a first trace on a second surface of dielectric substrate into a first dipole structure, patterning a second portion of the first trace on the second surface of the dielectric substrate into a first reflector and positioning the portion's of traces on the first and second surfaces greater than or equal to a millimeter from both near edges and a far edge of the dielectric substrate, thereby forming the endfire antenna. A second portion of the first trace on the first surface is patterned into a plurality of solder pads and the solder pads are connected to either of the first conductor traces. The dielectric substrate is coupled to free space through the far edge of the dielectric substrate and the dielectric substrate resonates by a signal sourced from the solder pads or the free space, such that the signal is communicated between the free space and the plurality of solder pads. A first portion of a second trace on the first surface and a first portion of a second trace on the second surface is patterned into a second dipole structure and a second portion of the second trace on the second surface of the dielectric substrate is patterned into a second reflector. By forming at least one notch in the dielectric substrate, the first traces are isolated from the second traces. This allows the first dipole structure to resonate substantially independently from the second dipole structure.

A summary of some of the inventive alignment techniques for a 60 GHz endfire antenna are provided.

An array of endfire antennas on a first surface provides coverage a first signal over a second surface. A portable unit with a first endfire antenna near the second surface is aligned to receive the first signal, a second signal emitted from the first endfire antenna is received by one of endfire antennas in the array on the first surface, and a communication channel is formed between the first endfire antenna and the endfire antenna in the array. The communication channel contains data, video, audio, or a combination of all three. The first surface is a ceiling or a wall and the second surface is a floor of auditorium, conference room, residential room or shopping mall. An additional possibility mounts the endfire antennas in the array on a rotatable platform. A computerized system rotates the rotatable platform to maximize the communication channel. Each of the endfire antennas in the array contains multiple endfire antennas coupled together and offset from one another.

A first portable unit is placed on a planar surface, a second portable unit placed on the planar surface, a first endfire antenna in the first portable unit is aligned with a second endfire antenna in the second portable unit, a first signal emitted from the first endfire antenna is received by the second endfire antenna, a second signal emitted from the second endfire antenna received by the first endfire antenna and a communication channel is formed between the first portable unit and the second portable unit. An alignment mark printed on the body of the portable units is used to indicate endfire antenna orientation or an audio or a visual signal is used to adjust the position of the portable units to improve the communication channel. At least one user adjusts the position of the portable units to improve the communication channel. Another possibility is the placement of the first portable unit on a first rotational platform and the second portable unit on a second rotational platform, then a computerized system adjusts the rotational platforms to maintain the alignment between the first and second portable units while these two units are moving. The alignment is used for an operational procedure including collision avoidance detection, transfer of data and assembly line manufacture.

A method of forming a communication channel comprises providing coverage of a first signal over a second surface with an array of endfire antennas on a first surface, aligning a portable unit with a first endfire antenna near the second surface to receive the first signal, receiving a second signal emitted from the first endfire antenna by one of endfire antennas in the array and forming the communication channel between the first endfire antenna and the endfire antenna in the array. The first surface is a ceiling or a wall and the second surface is a floor of an auditorium, conference room, residential room and shopping mall. One possibility mounts each of the endfire antennas in the array on a rotatable platform allowing the communication channel to be maximized by a computerized system that rotates the rotatable platforms. Another is coupling multiple endfire antennas together in each of the endfire antennas in the array. Finally, the communication channel is switched between the endfire antennas or a Wi-Fi system to provide a power management feature.

Finally, it is understood that the above description are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the an may devise numerous modifications without departing from the spirit and scope of the invention. Although the antennas were described using an LTCC substrate, other dielectrics with a large dielectric constant (>5) can be used as well. A trace is conducting or metallic and can be formed from metals, such as, copper, aluminum, gold, or silver, dependent on the technology that is used. A planar surface does not need to be continuous as, for example, a table top. The surfaces of two tables separated from one another can share a common planar surface if the surfaces are substantially parallel to one another. Endfire antennas provide electromagnetic radiation that provides coverage over a volume of space and when a plane intersects the volume, the surface of that plane has coverage. Thus, a floor can have coverage if an array of endfire antennas are on the ceiling and those standing on the floor would also have coverage. In addition, a network and a portable system can exchange information wirelessly by using communication techniques such as TDMA (Time Division Multiple Access), FDMA (Frequency Division Multiple Access), CDMA (Code Division Multiple Access), OFDM (Orthogonal Frequency Division Multiplexing), UWB (Ultra Wide Band), WiFi, WiGig, Bluetooth, etc. The network can comprise the phone network, IP (Internet protocol) network, LAN (Local Area Network), ad hoc networks, local routers and even other portable systems.

What is claimed is:

1. An endfire antenna comprising:
a dielectric substrate with a dielectric constant greater than or equal to 5, the dielectric substrate comprising two near edges and a far edge, wherein the dielectric substrate is configured to resonate when a signal is applied;
a first trace fabricated to form a first dipole arm on a top surface of the dielectric substrate;
a second trace fabricated to form a second dipole arm on a bottom surface of the dielectric substrate;
the first trace and the second trace forming a dipole, the dipole positioned an equal distance from each of the two near edges and at least one guided-wave length from the far edge, wherein a section of the second trace is patterned into a remaining portion of the dipole;
a microstrip line connecting the first dipole arm to a feed point on the top surface, wherein another section of the second trace is patterned into a reflector, wherein the reflector serves as a ground plane for the microstrip line, and wherein the ground plane is truncated covering a partial area of the bottom surface,
wherein a perpendicular distance from the first dipole arm and the second dipole arm to an edge of the reflector is about a length of the first dipole arm,
wherein the far edge is in an endfire direction to enable transmission of electromagnetic energy, and wherein the two near edges are located perpendicular to the far edge; and
a solder pad connected to the first trace or the second trace to couple the signal to the dielectric substrate.

2. The endfire antenna of claim 1, wherein a section of the first trace is patterned into one portion of the dipole and a section of the second trace is patterned into a remaining portion of the dipole.

3. The endfire antenna of claim 2, wherein another section of the second trace is patterned into a reflector.

4. The endfire antenna of claim 3, wherein the signal is coupled into free space as the electromagnetic energy from the far edge of the dielectric substrate.

5. The endfire antenna of claim 3, wherein the signal is coupled from free space into the dielectric substrate by the electromagnetic energy incident on the far edge of the dielectric substrate.

6. The endfire antenna of claim 3, wherein the first trace and the second trace are greater than or equal to a millimeter from the at least one near edge and the far edge.

7. The endfire antenna of claim 1, further comprising: an integrated circuit chip coupled to at least one solder bump; the solder bump being connected to the solder pad.

8. The endfire antenna of claim 1, wherein the first trace extends parallel to each of the two near edges.

9. The endfire antenna of claim 1, wherein each of the first trace and the second trace is equidistant from each of the two near edges.

10. The endfire antenna of claim 1, wherein the length of the first dipole arm is 0.58 mm.

11. A method of forming an endfire antenna comprising:
patterning a first portion of a first trace to form a first dipole arm on a first surface of a dielectric substrate and a first portion of a first trace to form a second dipole arm on a second surface of the dielectric substrate, wherein the first dipole arm and the second dipole arm form a first dipole structure;
patterning a second portion of the first trace on the second surface of the dielectric substrate into a first reflector wherein a perpendicular distance from the first dipole arm and the second dipole arm to an edge of the first reflector is about a length of the first dipole arm; and
positioning the portions of traces on the first surface and the second surface an equal distance from two near edges and at least one guided-wave length from a far edge of the dielectric substrate, wherein the far edge is in an endfire direction to enable transmission of electromagnetic energy, and wherein the two near edges are located perpendicular to the far edge.

12. The method of claim 11, further comprising:
patterning a second portion of the first trace on the first surface into a plurality of solder pads; and
connecting the plurality of solder pads to the first traces.

13. The method of claim 12, further comprising:
coupling the dielectric substrate to free space through the far edge of the dielectric substrate; and
resonating the dielectric substrate by a signal sourced from the plurality of solder pads or the free space, such that the signal is communicated between the free space and the plurality of solder pads.

14. The method of claim 11, further comprising:
patterning a first portion of a second trace on the first surface and a first portion of a second trace on the second surface into a second dipole structure; and
patterning a second portion of the second trace on the second surface of the dielectric substrate into a second reflector.

15. The method of claim 14, wherein the first dipole structure resonates independently from the second dipole structure.

* * * * *